(12) United States Patent
Ajtai et al.

(10) Patent No.: US 6,374,250 B2
(45) Date of Patent: *Apr. 16, 2002

(54) SYSTEM AND METHOD FOR DIFFERENTIAL COMPRESSION OF DATA FROM A PLURALITY OF BINARY SOURCES

(75) Inventors: Miklos Ajtai, Los Gatos; Randal Chilton Burns, Sunnyvale; Ronald Fagin, Los Gatos; Larry Joseph Stockmeyer, San Jose, all of CA (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/794,134

(22) Filed: Feb. 3, 1997

(51) Int. Cl.⁷ .............................................. G06F 17/30
(52) U.S. Cl. .............................. 707/101; 707/6; 707/3; 707/1; 341/50; 341/67; 341/95; 711/202; 708/203
(58) Field of Search ................................. 707/6, 101, 1, 707/3, 200; 341/106, 51, 67, 50, 95, 87; 717/11; 380/28; 382/181, 190; 708/203; 711/202

(56) References Cited

U.S. PATENT DOCUMENTS

| | | | |
|---|---|---|---|
| 4,807,182 A | * 2/1989 | Queen | 707/511 |
| 4,991,087 A | * 2/1991 | Burkowski et al. | 707/3 |
| 5,003,307 A | * 3/1991 | Whiting et al. | 341/51 |
| 5,129,082 A | * 7/1992 | Tirfing | 707/3 |
| 5,278,979 A | * 1/1994 | Foster et al. | 707/203 |
| 5,297,038 A | * 3/1994 | Saito | 707/1 |
| 5,384,598 A | 1/1995 | Rodriguez et al. | 348/384 |
| 5,392,072 A | 2/1995 | Rodriguez et al. | 348/405 |

(List continued on next page.)

OTHER PUBLICATIONS

Randal C. Burns, "Differential Compression: A Generalized solution for binary files", A thesis in completion of the Master's of Science degree, Department of Computer Science, University of California, Santa Cruz, Dec. 1996.*

Burns et al., "A linear time, constant space differencing algorithm", In Proceedings of the 1997 International Performance, Computing and Communications Conference (IPCCC), Feb. 5–7, Tempe, Arizona, USA Feb. 1997.*

A. Alderson, "A Space–efficient Technique for Recording Versions of Data", *Software Engineering Journal*, vol. 3, No. 6, Jun. 1988, pp. 240–246.

(List continued on next page.)

*Primary Examiner*—Jean M. Corrielus
(74) *Attorney, Agent, or Firm*—James C. Pintner; R. Bruce Brodie

(57) ABSTRACT

A method and a system are presented for generating differentially compressed output from binary sources. Given two versions of the same file as input streams, a compact encoding of one of the input streams is generated, by representing it as a set of changes with respect to the other input stream. Algorithms for differencing files requiring time linear in the size of the input and a constant amount of space for execution are presented. In addition, advanced techniques for improving existing differencing algorithms are developed and applied to previous methods. These techniques allow algorithms to increase their efficiency without a loss of compression and to accept arbitrarily large inputs without sacrificing correctness or degrading the compression data rate. The differential compression methods provide a computationally efficient compression technique for applications that generate versioned data.

13 Claims, 19 Drawing Sheets

U.S. PATENT DOCUMENTS

| | | | |
|---|---|---|---|
| 5,490,221 A | | 2/1996 | Ransford et al. ............ 382/130 |
| 5,542,090 A | * | 7/1996 | Henderson et al. ............. 707/2 |
| 5,574,906 A | | 11/1996 | Morris ........................ 395/601 |
| 5,649,200 A | * | 7/1997 | Lebrang et al. ............. 395/703 |
| 5,689,703 A | * | 11/1997 | Atkinson et al. ........... 707/102 |
| 5,715,454 A | * | 2/1998 | Smith .......................... 707/203 |
| 5,745,906 A | * | 4/1998 | Squibb ........................ 707/203 |
| 5,768,532 A | * | 6/1998 | Megerian ............... 395/200.75 |
| 5,787,431 A | * | 7/1998 | Shaughnessy ............... 707/100 |
| 5,794,254 A | * | 8/1998 | McClain ..................... 707/204 |

OTHER PUBLICATIONS

A.P. Black et al., "A Compact Representation for File Versions: A Preliminary Report", *IEEE Proceedings of the 5th International Conference of Data Engineering*, 1989, pp. 321–329.

A. Ehrenfeucht et al., "A New Distance Metric on Strings Computable in Linear Time", *Discrete Applied Mathematics*, vol. 20, 1988, pp. 191–203.

C. W. Fraser et al., "An Editor for Revision Control", *ACM Transactions on Programming Languages and Systems*, vol. 9, No. 2, Apr. 1987, pp. 277–295.

R. M. Karp et al., "Efficient Randomized Pattern–matching Algorithms", *IBM Journal of Research and Development*, vol. 31, No. 2, Mar. 1987, pp. 249–260.

W. Miller et al., "A File Comparison Program", *Software—Practice and Experience*, vol. 15, No. 11, Nov. 1985, pp. 1025–1040.

J. Plaice et al., "A New Approach to Version Control", *IEEE Transactions on Software Engineering*, vol. 19, No. 3, Mar. 1993, pp. 268–275.

C. Reichenberger, "Delta Storage for Arbitrary Non–text Files", *ACM Proceedings of the 3rd International Workshop on Software Configuration Management*, Jun. 12–14, 1991, pp. 144–152.

M. J. Rochkind, "The Source Code Control System", *IEEE Transactions on Software Engineering*, vol. SE–1, No. 4, Dec. 1975, pp. 364–370.

W. F. Tichy, "The String–to–String Correction Problem with Block Moves", *ACM Transactions on Computer Systems*, vol. 2, No. 4, Nov. 1984, pp. 309–321.

W. F. Tichy, "RCS—A System for Version Control", *Software—Practice and Experience*, vol. 15, No. 7, Jul. 1985, pp. 637–654.

R. A. Wagner et al., "The String–to–String Correction Problem", *Journal of the Association for Computing Machinery*, vol. 21, No. 1, Jan. 1974, pp. 168–173.

L. Yu et al., "A Linear–time Scheme for Version Reconstruction", *ACM Transactions on Programming Languages and Systems*, vol. 16, No. 3, May 1994, pp. 775–797.

* cited by examiner

```
procedure GreedyDifference (footprintLength : number; baseFile, verFile, diffFile : stream )

local ver_pos, add_start, copy_start : number;
local hashtable[HASHTABLESIZE] : number;
local linktable[length(baseFile)] : number;

begin
    ver_pos ← 0;
    add_start ← 0;

** Fill the Hash Table and Link List with Footprints from the baseFile **

BuildHashTable (baseFile, hashtable, linktable);

while (ver_pos ≤ length(verFile) - footprintLength)

** FindBestMatch hashes a footprint at ver_pos in verFile, looks at all matching **
    ** strings in the hash table and link list, and sets copy_start and copy_length **
    ** to the offset and length of that string in baseFile **

FindBestMatch (ver_pos, copy_start, copy_length, hashtable, linktable);

if (copy_len ≥ footprintLength)
            if (add_start < verPos)
                EmitAdd (add_start, ver_pos - add_start, verFile, diffFile);
            end if EmitCopy (ver_pos, copy_start, copy_length, verFile, baseFile, diffFile);
            ver_pos ← ver_pos + copy_len;
            add_start ← ver_pos;
```

FIG. 4    (PRIOR ART)

```
else
    ver_pos ← ver_pos + 1;
  end if
endwhile
EmitEnd(diffFile);
end
```

FIG. 4a (PRIOR ART)

```
procedure LinearDifference (footprintLength : number; baseFile, verFile, diffFile : stream)

local baseh, verh, base_pos, ver_pos, ver_start : number;
local hashtable[HASHTABLESIZE] : struct hash_entry:
local base_active : flag begin
   ver_pos ← 0;
   base_pos ← 0;
   base_active ← TRUE;

while (ver_pos ≤ length(verFile) − footprintLen)

verh ← Footprint (verFile[ver_pos]);

if (base_active)
         baseh ← Footprint (baseFile[base_pos]);
      end if if ((BASEFILE = hashtable[verh].file) and (Verify (baseFile[hashtable[verh].offset], verFile[ver_pos])))
         length ← EmitCodes (hashtable[verh].offset, ver_pos, ver_start, baseFile, verFile, diffFile);
         base_pos ← hashtable[verh] + length;
         ver_pos ← ver_pos + length;
         ver_start ← ver_pos;
         FlushHashTable(hashtable);
         continue;
      else
         hashtable[verh].offset ← ver_pos;
         hashtable[verh].file ← VERFILE;
      end if
```

FIG. 5

```
if ((base_pos ≤ length(baseFile) - footprintLen) and (base_active))
  if ((VERFILE = hashtable[baseh].file) and
      (Verify (verFile[hashtable[baseh].offset], baseFile[base_pos])) and
      (ver_start ≤ hashtable[baseh].offset))

length ← EmitCodes (base_pos, hashtable[baseh].offset, ver_start, baseFile, verFile, diffFile);
    ver_pos ← ver_pos + length;
    base_pos ← base_pos + length;
    ver_start ← ver_pos;
    FlushHashTable(hashtable);
    continue;
  else
    hashtable[baseh].offset ← ver_pos;
    hashtable[baseh].file ← BASEFILE;
  end if
else
  base_active ← FALSE;
end if
ver_pos ← ver_pos + 1;
base_pos ← base_pos + 1;
end while
EmitCodes (length(baseFile), length(verFile), ver_start, baseFile, verFile, diffFile);
EmitEnd (diffFile);
end
```

*FIG. 5a*

```
number procedure EmitCodes (basePos, verPos, verStart : number; baseFile, verFile, diffFile : stream)

local copy_length : number;

begin
    if (verPos > verStart)
        EmitAdd (verStart, verPos − verStart, verFile, diffFile);
    end if

Find the longest identical string between the matching footprints copy_length ← ExtendMatch (baseFile[basePos], verFile[verPos]);
    length ← EmitCopy (verPos, basePos, copy_length, verFile, baseFile, diffFile);

return length;
end
```

*FIG. 6*

```
procedure OneAndAHalfPass (prefixLength : number; baseFile, verFile, diffFile : stream )

local ver_pos, add_start, copy_start : number;
local hashtable[HASHTABLESIZE] : number;

begin
    ver_pos ← 0;
    add_start ← 0;

** Fill the Hash Table with Footprints from the baseFile **

BuildHashTable (baseFile, hashtable);

while (ver_pos ≤ length(verFile) - prefixLength)

** FindFirstMatch hashes a footprint at ver_pos in verFile, looks in the hash table for a matching **
    ** sequence, and sets copy_start and copy_length to the offset and length of that sequence in baseFile **

FindFirstMatch (ver_pos, copy_start, copy_length, hashtable, verFile, baseFile);

if (copy_len ≥ prefixLength)
            if (add_start ≤ verPos)
                FixupBufferInsertAdd (add_start, ver_pos - add_start, verFile, diffFile);
            end if FixupBufferInsertCopy (ver_pos, copy_start, copy_length, verFile, baseFile, diffFile);
            ver_pos ← ver_pos + copy_len;
            add_start ← ver_pos;
        else
            ver_pos ← ver_pos + 1;
```

FIG. 10

```
        end if
    endwhile
    FixupBufferInsertEnd (diffFile);
    FlushFixupBuffer (verFile, diffFile);
end
```

FIG. 10a

```
procedure FixupBufferInsertCopy (verPos, basePos, copyLen : number; baseFile, verFile, diffFile : stream)

local back_copy_length, reclaimed_length : number;
local current_el* : buffer_el;

begin
    reclaimed_length ← 0;
    back_copy_length ← ExtendMatchBackwards (verFile[verPos], baseFile[basePos]);

LastBufferEl returns the top element in the Fixup Buffer current_el ← LastBufferEl ();

while (back_copy_length ≥ current_el.length)
        reclaimed_length ← reclaimed_length + current_el.length;
        current_el ← PopBufferEl (current_el);
    end while

Encode the forward copy and place of Fixup Buffer current_el ← PushBufferEl (current_el);
    current_el.length ← copyLength + reclaimed_length;
    current_el.offset ← basePos − reclaimed_length;
    current_el.position ← verPos − reclaimed_length;
end
```

FIG. 11

```
procedure OnePass (prefixLength : number; baseFile, verFile, diffFile : stream)

local baseh, verh, base_pos, ver_pos, ver_start : number;
local verhashtbl[HASHTABLESIZE] basehashtbl[HASHTABLESIZE] : number;
local base_active, version_active : flag begin
  ver_pos ← 0; base_pos ← 0;
  base_active ← TRUE; version_active ← TRUE;

while (base_active or version_active)

if (ver_pos ≤ length(verFile) - prefixLength)
      verh ← Footprint (verFile[ver_pos]);
      verhashtbl[verh] ← ver_pos;
      if ((SENTINEL ≠ basehashtbl[verh]) and (Verify (baseFile [basehashtbl[verh]], verFile[ver_pos])))
        length ← EmitCodes (basehashtbl[verh], ver_pos, ver_start, baseFile, verFile, diffFile);
        base_pos ← max (base_pos, basehashtbl[verh] + length);
        ver_pos ← ver_pos + length;
        ver_start ← ver_pos;
        continue;
      end if
    else
      version_active ← FALSE;
    end if if (base_pos ≤ length(baseFile) - prefixLength)
      baseh ← Footprint (baseFile[base_pos]);
      basehashtbl[baseh] ← base_pos;
      if ((SENTINEL ≠ verhashtbl[baseh]) and (Verify (verFile[verhashtbl[baseh]], baseFile[base_pos])))
```

FIG. 12

```
if (ver_start ≤ verhashtbl[baseh])
    length ← EmitCodes (base_pos, verehashtbl[baseh], ver_start, baseFile, verFile, diffFile);
    base_pos ← base_pos + length;
    ver_pos ← verhashtbl[baseh] + length;
    ver_start ← ver_pos;
    continue;
else
    FixupEncoding (base_pos, verhashtbl[baseh], baseFile, verFile, diffFile);
end if
end if
else
    base_active ← FALSE;
end if
ver_pos ← ver_pos + 1;
base_pos ← base_pos + 1;
end while EmitCodes (length(baseFile), length(verFile), ver_start, baseFile, verFile, diffFile);
FixupBufferInsertEnd (diffFile);
FlushFixupBuffer (verFile, diffFile);
end
```

FIG. 12a

```
number procedure EmitCodes (basePos, verPos, verStart : number; baseFile, verFile, diffFile : stream)

local copy_length : number;

begin if (verPos > verStart)
        FixupBufferInsertAdd (verStart, verPos − verStart, verFile, diffFile);
    end if

Find the longest identical sequence between the matching footprints copy_length ← ExtendMatch (baseFile[basePos], verFile[verPos]);
    length ← FixupBufferInsertCopy (verPos, basePos, copy_length, verFile, baseFile, diffFile);

return length;
end
```

FIG. 13

```
number procedure FixupEncoding (basePos, verPos : number; reclaimed_length : number; baseFile, verFile, diffFile : stream)

local ret_value, copy_length, reclaimed_length : number;
local current_el* : buffer_el;

begin
    reclaimed_len ← 0;

** Find the longest matching sequence that contains these matching footprints **
    copy_len ← ExtendMatch (baseFile[basePos], verFile[verPos]);

** Locate the entry that encodes start of the match in the code word buffer **
    current_el ← FindPreviousEncoding (verPos);
    if (current_el = NULL)
        return 0;
    endif

** Reclaim as many codewords as possible and remove them from the cache **
    do
        ret_value ← Reclaim (copy_length, current_el, verFile, diffFile);
        copy_len ← copy_len - ret_val;
        reclaimed_length ← reclaimed_length + ret_value;
        if ( retval ≠ current_el.length )
            break;
        endif
        current_el ← NextBufferEl (current_el);
    while (1);
```

FIG. 14

\*\* Re-encode the reclaimed codewords as a single copy \*\*
if (reclaimed_length > 0)
   current_el ← InsertBufferEl (current_el);
   current_el.length ← reclaimed_length;
   current_el.offset ← basePos;
   current_el.position ← verPos;
endif return reclaimed_length;
end

FIG. 14a

SYSTEM AND METHOD FOR DIFFERENTIAL COMPRESSION OF DATA FROM A PLURALITY OF BINARY SOURCES

FIELD OF THE INVENTION

The invention generally relates to the field of data compression. More specifically, the invention relates to techniques, applicable to data which occurs in different versions, for finding differences between the versions.

BACKGROUND OF THE INVENTION
DIFFERENCING ALGORITHMS AND DELTA FILES

Differencing algorithms compress data by taking advantage of statistical correlations between different versions of the same data sets. Strictly speaking, differencing algorithms achieve compression by finding common sequences between two versions of the same data that can be encoded using a copy reference.

The term "file" will be used to indicate a linear data set to be addressed by a differencing algorithm. Typically, a file is modified one or more times, each modification producing a successive "version" of the file.

While this terminology is conventional, differencing applies more generally to any versioned data and need not be limited to files.

A differencing algorithm is defined as an algorithm that finds and outputs the changes made between two versions of the same file by locating common sequences to be copied, and by finding unique sequences to be added explicitly.

A delta file ($\Delta$) is the encoding of the output of a differencing algorithm. An algorithm that creates a delta file takes as input two versions of a file, a base file and a version file to be encoded, and outputs a delta file representing the incremental changes made between versions.

$$F_{base} + F_{version} \rightarrow \Delta_{(base, version)}$$

Reconstruction, the inverse operation, requires the base file and a delta file to rebuild a version.

$$F_{base} + \Delta_{(base, version)} \rightarrow F_{version}$$

FIG. 1 is an illustration of the process of creating a delta file from a base file and a version file. A base file 2 and a version file 4 are shown schematically, in a linear "memory map" format. They are lined up parallel to each other for illustrative purposes.

Different versions of a file may be characterized as having sequences of data or content. Some of the sequences are unchanged between the versions, and may be paired up with each other. See, for instance, unchanged sequences 6 and 8. By contrast, a sequence of one version (e.g., a sequence 10 in the base file) may have been changed to a different sequence in the version file (e.g., 12).

One possible encoding of a delta file, shown as 14, consists of a linear array of editing directives. These directives include copy commands, such as 16, which are references to a location in the base file 2 where the same data as that in the version file 4 exists; and further include add commands, such as 18, which are instructions to add data into the version file 4, the add data instruction 18 being followed by the data (e.g., 20) to be added.

In any representation scheme, a differencing algorithm must have found the copies and adds to be encoded. Such other encoding techniques are compatible with the methods to be presented in accordance with the invention.

DIFFERENTIAL ALGORITHMS APPLIED

Several potential applications of version differencing motivate the need for a compact and efficient differencing algorithm. Such an algorithm can be used to distribute software over a low bandwidth network such as a point-to-point modem link or the Internet. Upon releasing a new version of software, the version is differenced with respect to the previous version. With compact versions, a low bandwidth channel can effectively distribute a new release of dynamically self-updating software in the form of a binary patch. This technology has the potential to greatly reduce time to market on a new version, and to ease the distribution of software customizations. For replication in distributed file systems, differencing can reduce by a large factor the amount of information that needs to be updated by transmitting deltas for all of the modified files in the replicated file set.

In distributed file system backup and restore, differential compression would reduce the time to perform file system backup, decrease network traffic during backup and restore, and lessen the storage to maintain a backup image. See U.S. Pat. No. 5,574,906, issued to Robert Morris, titled "System and Method for Reducing Storage Requirement in Backup Subsystems Utilizing Segmented Compression and Differencing".

The '906 patent describes that backup and restore can be limited by both bandwidth on the network, often 10 MB/s, and poor throughput to secondary and tertiary storage devices, often 500 KB/s to tape storage. Since resource limitations frequently make backing up just the changes to a file system infeasible over a single night or even weekend, differential file compression has great potential to alleviate bandwidth problems by using available processor cycles to reduce the amount of data transferred. This technology can be used to provide backup and restore services on a subscription basis over any network including the Internet.

PREVIOUS WORK IN DIFFERENCING

Differencing has its origins in longest common subsequence (LCS) algorithms, and in the string-to-string correction problem. For examples of the former, see A. Apostolico, S. Browne, and C. Guerra, "Fast linear-space computations of longest common subsequences", Theoretical Computer Science, 92(1):3–17, 1992 and Claus Rick, "A new flexible algorithm for the longest common subsequence problem", Proceedings of the 6th Annual Symposium on Combinatorial Pattern Matching Espoo, Finland, Jul. 5–7, 1995. For an example of the latter, see R. A. Wagner and M. J. Fischer, "The string-to-string correction problem", Journal of the ACM, 21(1):168–173, January 1973.

Some of the first applications of differencing updated the screens of slow terminals by sending a set of edits to be applied locally rather than retransmitting a screen full of data. Another early application was the UNIX "diff" utility, which used the LCS method to find and output the changes to a text file. diff was useful for source code development and for primitive document control.

LCS algorithms find the longest common sequence between two strings by optimally removing symbols in both files leaving identical and sequential symbols. (A string/substring contains all consecutive symbols between and including its first and last symbol, whereas a sequence/subsequence may omit symbols with respect to the corresponding string.)

While the LCS indicates the sequential commonality between strings, it does not necessarily detect the minimum set of changes. More generally, it has been asserted that string metrics that examine symbols sequentially fail to emphasize the global similarity of two strings. See A. Ehrenfeucht and D. Haussler, "A new distance metric on strings computable in linear time", Discrete Applied Mathematics, 20:191–203, 1988.

In Webb Miller and Eugene W. Myers, "A file comparison program", Software—Practice and Experience, 15(11) :1025–1040, November 1985, the limitations of LCS are established, with regard to a new file compare program that executes at four times the speed of the diff program while producing significantly smaller deltas.

In Walter F. Tichy, "The string-to-string correction problem with block move", ACM Transactions on Computer Systems, 2(4), November 1984, the edit distance is shown to be a better metric for the difference of files, and techniques based on this method enhanced the utility and speed of file differencing. The edit distance assigns a cost to edit operations such as "delete a symbol", "insert a symbol", and "copy a symbol". For example, one longest common subsequence between strings xyz and xzy is xy, which neglects the common symbol z. Using the edit distance metric, z may be copied between the two strings producing a smaller change cost than LCS.

In the string-to-string correction problem given in Wagner et al. (supra), an algorithm minimizes the edit distance to minimize the cost of a given string transformation.

In Tichy (supra), the string-to-string correction problem is adapted to file differencing using the concept of block move. Block move allows an algorithm to copy a string of symbols, rather than an individual symbol. The algorithm is then applied to source code revision control package, to create RCS. See Walter F. Tichy, "RCS—A system for version control", Software—Practice and Experience, 15(7): 637–654, July 1985.

RCS detects the modified lines in a file, and encodes a delta file by adding these lines and indicating lines to be copied from the base version. This is referred to as "differencing at line granularity." The delta file is a line-by-line edit script applied to a base file to convert it to the new version. Although the SCCS version control system (Marc J. Rochkind, "The source code control system", IEEE Transactions on Software Engineering, SE-1 (4):364–370, December 1975.) precedes RCS, RCS generates minimal line granularity delta files, and is the definitive previous work in version control.

Source code control has been the major application for differencing. These packages allow authors to store and recall file versions. Software releases may be restored exactly, and changes are recoverable. Version control has also been integrated into a line editor, so that on every change a minimal delta is retained. See Christopher W. Fraser and Eugene W. Myers, "An editor for revision control", ACM Transactions on Programming Languages and Systems, 9(2):277–295, April 1987. This allows for an unlimited undo facility without excessive storage.

THE GREEDY ALGORITHM

A well-known class of differencing algorithms may be termed "greedy" algorithms. Greedy algorithms often provide simple solutions to optimization problems by making what appears to be the best decision, i.e., the "greedy" decision, at each step. For differencing files, the greedy algorithm takes the longest match it can find at a given offset on the assumption that this match provides the best compression. It makes a locally optimal decision with the hope that this decision is part of the optimal solution over the input.

A greedy algorithm for file differencing is given by Christoph Reichenberger, "Delta storage for arbitrary non-text files", Proceedings of the 3rd International Workshop on Software Configuration Management, Trondheim, Norway, Jun. 12–14, 1991, pages 144–152. ACM, June 1991.

For file differencing, the greedy algorithm provides an optimal encoding of a delta file, but it requires time proportional to the product of the sizes of the input files. We present an algorithm which approximates the greedy algorithm in linear time and constant space by finding the match that appears to be the longest without performing exhaustive search for all matching strings.

DELTA COMPRESSION WITH GREEDY TECHNIQUES

Given a base file and another version of the same file, the greedy algorithm for constructing differential files finds and encodes the longest copy in the base file corresponding to the first offset in the version file. After advancing the offset in the version file past the encoded copy, it looks for the longest copy starting at the current offset. If at a given offset, it cannot find a copy, the symbol at this offset is marked to be added and the algorithm advances to the following offset.

Referring now to FIG. 3, the first task the algorithm performs is to construct a hash list and a link list out of the base version of the input files. The hash table allows an algorithm to store or identify the offset of a string with a given footprint. The link list stores the offsets of the footprints, beyond the initial footprint, that hash to the same value. In this example, strings at offset A1, A2, A3, and A4 all have a footprint with value A. The link list effectively performs as a re-hash function for this data structure.

These data structures are assembled, for instance by the function BuildHashTable in FIG. 4.

The algorithm then finds the matching strings in the file. The FindBestMatch function in FIG. 4 hashes the string at the current offset and returns the longest match that contains the string identified by the footprint. The function exhaustively searches through all strings that have matching footprints by fully traversing the link list for the matched hash entry. If the current offset in the version file verFile has footprint A, the function looks up the A-th element in the hash table to find a string with footprint A in the base file. In hashtable[A], we store the offset of the string with a matching footprint. The string at the current offset in the version file is compared with the string at hashtable[A] in the base file. The length of the matching string at these offsets is recorded. The function then moves to linktable[hashtable [A]] to find the next matching string. Each successive string in the link table is compared in turn. The longest matching string with offset copy_start and length copy_length is returned by the function FindBestMatch.

Alternatively, if FindBestMatch finds no matching string, the current offset in the version file (ver_pos) is incremented and the process is repeated. This indicates that the current offset could not be matched in the base version (baseFile) and will therefore be encoded as an add at a later time.

Once the algorithm finds a match for the current offset, the unmatched symbols previous to this match are encoded and output to the delta file, using the EmitAdd function, and the matching strings are output using the EmitCopy function. When all input from verFile has been processed, the algorithm terminates by outputting the end code to the delta file with the EmitEnd function.

ANALYSIS OF GREEDY METHODS

Common strings may be quickly identified by common footprints, the value of a hash function over a fixed length prefix of a string. The greedy algorithm must examine all matching footprints and extend the matches in order to find the longest matching string. The number of matching footprints between the base and version file can grow with respect to the product of the sizes of the input files, i.e. O(M×N) for files of size M and N, and the algorithm uses time proportional to the number of matching footprints.

In practice, many files elicit this worst case behavior. In both database files and executable files, binary zeros are stuffed into the file for alignment. This "zero stuffing" creates frequently occurring common footprints (discussed in detail below) which must all be examined by the algorithm. When a greedy algorithm finds a footprint in a version file, the greedy algorithm compares this footprint to all matching footprints in the base file. This requires it to maintain a canonical listing of all footprints in one file, generally kept by computing and storing a footprint at all string prefix offsets. See, for instance, Reichenberger (supra). Consequently, the algorithm uses memory proportional to the size of the input, O(N), for a size N file.

THE UNMET NEED FOR GENERALIZATION

While line granularity may seem appropriate for source code, the concept of revision control needs to be generalized to include binary files. This allows binary data, such as edited multimedia, binary software releases, database files, etc., to be revised with the same version control and recoverability guarantees as text. Whereas revision control is currently a programmers tool, binary revision control systems will enable the publisher, film maker, and graphic artist to realize the benefits of data versioning. It also enables developers to place image data, resource files, databases and binaries under their revision control system. Some existing version control packages have been modified to handle binary files, but in doing so they impose an arbitrary line structure. This results in delta files that achieve little or no compression as compared to storing the versions uncompressed.

An algorithm for binary differencing exists. See Reichenberger (supra).

While this algorithm handles binary inputs, it often requires time quadratic in the size of the input to execute, time O(M×N) for files of size M and N. As a consequence, the algorithm cannot be scaled to operate on arbitrarily large files and consequently cannot be applied to a wide variety of computer applications.

SUMMARY OF THE INVENTION

It is an object of this invention to devise a method and apparatus for forming a compressed differentially encoded image of a version file utilizing a base file.

It is a related object that such method and apparatus form the compressed encoded image within a time span linearly proportional to the size of the version and base files.

The foregoing objects are believed satisfied by a machine implementable method for forming a differentially encoded compressed image of a version file also utilizing the base file. The image is defined over a set of file building operations (ADD, COPY, END), length descriptors, and address pointers. In a so-called "one and one-half pass" rendition, the base file is recursively scanned using a window of m bytes in length shifted in the same direction k<m bytes/recursion. Significantly, a hash function wignature or fingerprint of the window contents is formed for each base file recursion with the signatures being dutifully written into scanned addressable buffer or the like. Next, the version file is recursively scanned also using a window of m bytes in length shifted in the same direction k<m bytes/recursion. A hash function or fingerprint of the windows content is formed and immediately compared with the buffer stored signatures of the base file. In the event of a comparison match of the signatures and verification of contents, a difference file is encoded ad seriatim a portion of the version file contents. This is copied from the later of either the start of the version file or the last comparison match up to the point of the instant comparison match. The difference file is further incoded with a COPY command, length attribute, and pointer to the base file location of the matching contents. The steps are repeated until the version file scan is exhausted.

In a so-called "one pass" rendition of the method of this invention, the base file and version file of recursively scanned respectively in time overlap relation and asynchronously using respective windows of m bytes granularity and k<m bytes alignment starting from predetermined location is in the respective files. During each recursion, a hash function signature of the respective windows contents is formed. The signature of the version file is then the compared with the signatures of the base file that have been so far formed. Upon a comparison match and verification of contents a point of synchronization is established. This permits the compressed image of the version file to be encoded ad seriatim as before.

Both renditions of the method and means of this invention further include checkpointing to reduce the number of signatures and increase the comparison speed and matching and a backwards extensibility of string matching to undo and then re-do the comparison matching and encoding process to enhance the compression of the differentially encoded image of the version file.

The invention describes a plurality of methods for binary differencing that can be integrated to form algorithms that efficiently compress versioned data. Several algorithms based on these methods are presented. These algorithms can difference any stream of data without a priori knowledge of the format or contents of the input. The algorithms drawn from the invention can difference data at any granularity including operating at the level of a byte or even a bit. Furthermore, these algorithms perform this task using linear run time and a constant amount of space. The algorithms accept arbitrarily large input file without a degradation in the rate of compression. Finally, these methods can be used to produce a steady and reliable stream of data for real time applications.

The invention is disclosed in several parts. Techniques useful to algorithms that generate binary differences are presented and these techniques are then integrated into algorithms to difference versioned data. It is understood that a person of ordinary skill in the art could assemble these techniques into one of many possible algorithms. The methods described as the invention then outline a family of algorithms for binary differencing using a combination of methods drawn from this invention.

While the invention is primarily disclosed as a method, it will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention.

Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

BRIEF DESCRIPTION OF THE DRAWINGS

FIGS. 4 and 4A show a pseudocode implementation of a conventional "greedy" differencing technique, employing the tables of FIG. 3.

FIGS. 5 and 5A show a pseudocode implementation of a "linear" embodiment of the method of the invention.

FIG. 6 is a pseudocode implementation of a procedure called from the pseudocode of FIGS. 5 and 5A.

FIGS. 10 and 10A show a pseudocode implementation of a "one-and-a-half-pass" embodiment of the method of the invention.

FIG. 11 is a pseudocode implementation of a procedure called from the pseudocode of FIGS. 10 and 10A.

FIGS. 12 and 12A show a pseudocode implementation of a "one pass" embodiment of the method of the invention.

FIG. 13 is a pseudocode implementation of a procedure called from the pseudocode of FIGS. 12 and 12A.

FIGS. 14 and 14A show a pseudocode implementation of another procedure called from the pseudocode of FIGS. 12 and 12A.

DESCRIPTION OF THE PREFERRED EMBODIMENT

ALGORITHMS FOR BINARY DIFFERENCING

Figure 1:
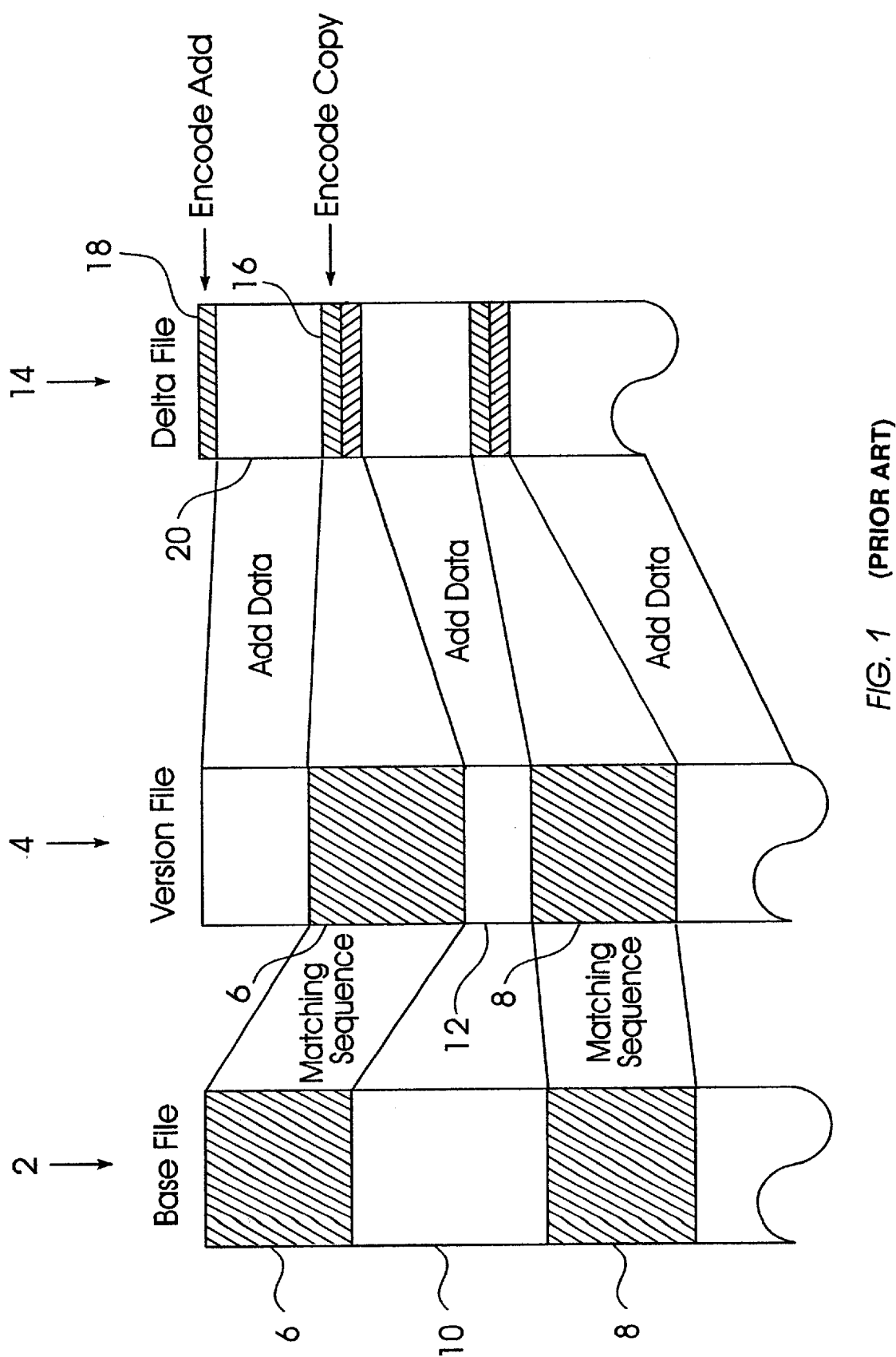
FIG. 1 is a schematic, memory-map view of two versions of a file, showing a differencing scheme according to the invention, the result of which is a difference file including markers for identical sections of the two versions.

Binary differencing algorithms all perform the same basic task. At the granularity of a byte, encode a set of version data as a set of changes from a base version of the same data. Due to their common tasks, all of the algorithms we examine share certain features. All binary differencing algorithms partition a file into two classes of variable length byte strings, those strings that appear in the base version and those that are unique to the version being encoded.

Initially, we develop some language and techniques that will be common to a whole family of algorithms. Having developed the methods, we present one possible algorithm, referred to as the "linear time algorithm", that embodies these techniques. Then, we present advanced techniques, called undoing the damage and checkpointing for binary differencing that extend the facilities of an algorithm. Based on these advanced methods, we present two of the many possible algorithms that embody this portion of the invention.

METHODS FOR BINARY DIFFERENCING: DATA STREAMS

The binary algorithms under consideration operate on data streams. We term a data stream to be a data source that is byte addressable, allows random access, and stores consecutive data contiguously. The data stream abstraction is more appropriate for this application than the file abstraction, as the file abstraction provides a greater level of detail than the algorithms require. Files consists of multiple blocks of data which may exist on multiple devices in addition to being non-contiguous in storage or memory. In UNIX parlance, this is called the i-node interface. Files also lack byte addressability. Reads on a file are generally performed at the granularity of a file block, anywhere from 512 bytes to 64 kilobytes.

Many systems, such as UNIX, offer a byte addressable, seek-able and virtually contiguous file interface in the kernel. The UNIX read, write, open, close, and seek functions allow an application to treat file data as a stream. For the remainder of this work, the term file will be used to indicate a linear data source that meets the properties of a data stream.

For our purpose, data streams and consequently files will be assumed to have array semantics, i.e. the n-th offset in file A can be referred to as A[n]. This convention corresponds to the concept of memory mapped I/O, where the bytes of a file are logically mapped to a contiguous portion of the virtual address space.

METHODS FOR BINARY DIFFERENCING: MATCHING STRINGS

A data stream or file is composed of successive symbols from an alphabet, where symbols are a fundamental and indivisible element of data. For our purposes, symbols may be considered bytes and the alphabet is the set of all bytes, all combinations of 8 bits. While bytes are not truly indivisible, they do represent a fundamental unit for write, read and copy operations in the data streams that we address. Any combination of sequential and contiguous bytes comprise a string.

A differencing algorithm finds the changes between two versions of the same data by partitioning the data into strings that have changed and strings that have not changed. Those strings that have not changed may be compressed by encoding them with a reference to the same data in the other file. The quality of a differencing algorithm depends upon its ability to find the maximum number of matching strings. The algorithm that produces the minimal delta finds a maximum total length of strings to be copied between files. In a minimal delta, the amount of data not copied represents the changed data between versions.

METHODS FOR BINARY DIFFERENCING: DELTA FILES—ENCODING THE CHANGES

Having found a partitioning of a version, the data stream must then be encoded in an output stream. In order to better compare different techniques, all of the algorithms we develop use the same file encoding.

Known encoding techniques may be used in connection with the invention. See, for instance, Reichenberger.

The Reichenberger encoding consists of three types of codewords. There is an ADD codeword, which is followed by the length of the string to add and the string itself, a COPY codeword, which is followed by the length of the copy and an offset in the base version that references the matching string, and an END codeword, which indicates the end of input. The formats of these codewords are summarized below. If required, such as in the case of the COPY command, a codeword may also specify additional bytes to follow.

ADD—0nnnnnnn

The seven bits (nnnnnnn) trailing the 0 specify the number of bytes following the codeword that need to be added to the version file.

COPY—1kknnnnn

All codewords starting with a 1 copy bytes from the base file to reconstruct the version file. The 5-bit field shown as nnnnn specifies the 5 lower bits for the copy length. The two-bit field kk selects from four formats for a copy command. The four formats include various following bytes. The four formats are tabulated here:

| kk | following bytes | offset bits | length bits | max offset | max length |
|----|----------------|-------------|-------------|------------|------------|
| 00 | ss             | 16          | 5           | 64 KB      | 32 bytes   |
| 01 | ssl            | 16          | 13          | 64 KB      | 8 Kbytes   |
| 10 | sssl           | 24          | 13          | 16 MB      | 8 Kbytes   |
| 11 | sssslll        | 32          | 29          | 4 GB       | 512 Mbytes |

An 's' indicates a following byte used to encode the offset in the base version. An 'l' indicates a following byte used to encode the length of the copy.

END—00000000

Terminate the processing of a delta file.

For our purposes, the choice of this encoding, as compared to an equally good or better encoding, has a negligible effect on the algorithmic performance. Therefore, the particular type of coding used is not essential to the invention.

METHODS FOR BINARY DIFFERENCING: FOOTPRINTS—IDENTIFYING MATCHING STRINGS

An algorithm that differences files needs to match strings of symbols that are common between two versions of the same file, a base file, the reference version for the difference, and a version file, the file to be encoded. In order to find these matching strings, the algorithm remembers strings that it has seen previously. However, the common strings may not be stored explicitly as this is no smaller than the file being encoded.

In order to compactly identify a fixed length string of symbols, that string will be reduced to a large integer by some hashing function. This large integer is the string's footprint. A footprint does not uniquely represent a string, but does exhibit the following property: two matching strings will always express matching footprints, or equivalently, footprints that do not match always imply that the strings they represent differ.

Note that it cannot be said that matching footprints imply matching strings. Since a footprint reduces the amount of information required to represent a given string, there are by definition fewer footprint values than possible combinations of strings. To determine if strings are identical in the presence of matching footprints, the strings themselves must be examined symbol by symbol.

Differencing algorithms will use footprints to remember and locate strings that have been seen previously. These algorithms use a hash table with size equal to the cardinality of the set of footprints, i.e. there is a one-to-one correspondence between potential footprint values and hash table entries. Each hash table entry holds, at a minimum, a reference to the string that generated the footprint.

When a string hashes to a value that already has an entry in the hash table, a potential match has been found. To verify that the strings match, an algorithm will look up the strings using the stored offsets and perform a symbol-wise comparison. Strings that match may be encoded as copies. Strings that differ are false matches, different strings with the same footprint, and should be ignored.

METHODS FOR BINARY DIFFERENCING: SELECTING A HASH ALGORITHM

Footprints are generated by a hashing function. A good hashing function for this application must be both run time efficient and generate a near uniform distribution of footprints over all footprint values. A non-uniform distribution of footprints results in differing strings hashing to the same footprint with higher probability.

Many hashing functions meet the requirement for a uniform distribution of keys. See Reichenberger (supra) or Alfred V. Aho, Ravi Sethi, and Jeffrey D. Ullman, "Compilers, principles, techniques, and tools", Addison-Wesley Publishing Co., Reading, Mass., 1986.

Figure 2:
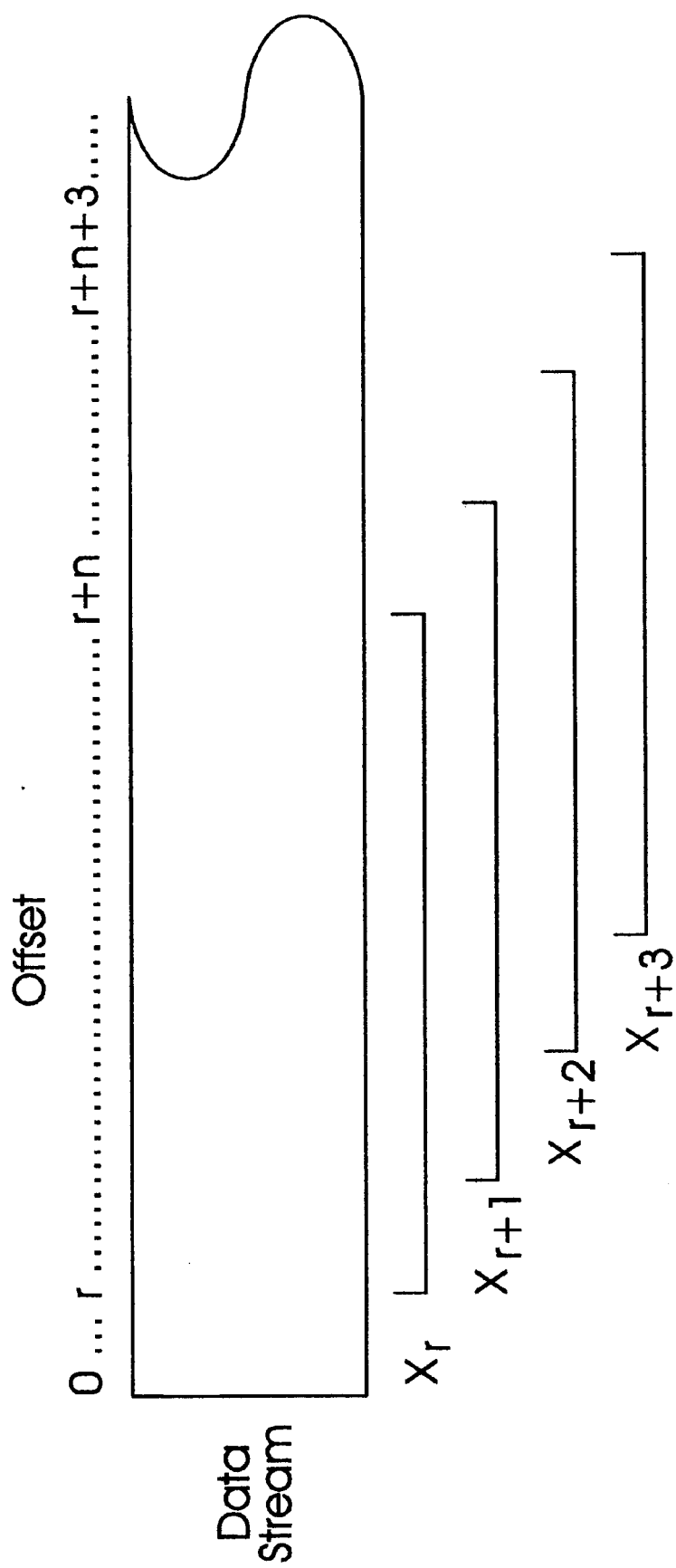
FIG. 2 is a snapshot representation of a data stream, showing, superimposed thereon, a group of fixed-length symbol strings used for footprinting in accordance with the invention.
Figure 3:
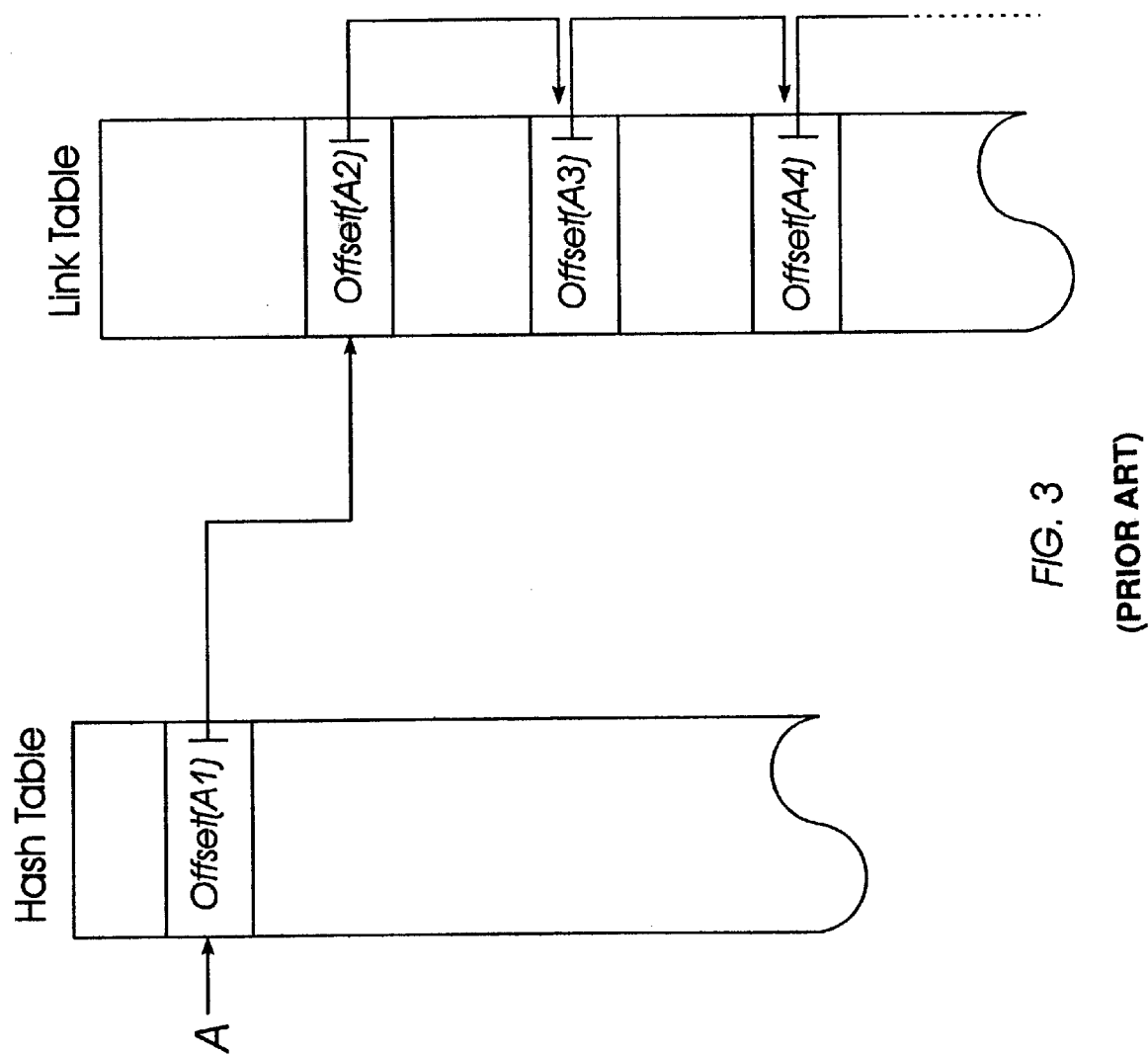
FIG. 3 is a schematic representation of conventional hash and link tables.

Differencing algorithms often need to calculate footprints at successive symbol offsets over a large portion of a file. For instance, FIG. 2 is a snapshot of a data stream made up of symbols, identified for the sake of illustration by an index, beginning at 0, and running through r, r+n, r+n+3, etc. Strings of n consecutive symbols are designated as X, with subscripts showing the index of the first of the n symbols. Brackets shown below the data stream, uniformly n symbols in width, are superimposed on the data stream to represent n-symbol strings. A hash function, run over these strings, generates footprints.

This additional requirement makes Karp-Rabin hashing functions more efficient than other methods. For a description of Karp-Rubin functions, see Richard M. Karp and Michael O. Rabin, "Efficient randomized pattern-matching algorithms", IBM Journal of Research and Development, 31(2):249–260, 1987. Karp-Rabin techniques permit the incremental calculation of footprints.

When calculating successive footprints, Karp-Rabin hashing dramatically improves the execution time of footprint generation and is consequently a significant performance benefit for differencing algorithms.

A SIMPLE LINEAR DIFFERENCING ALGORITHM

Previous algorithms for binary differencing (see Reichenberger supra) require time quadratic in the size of the input and use space that grows linearly in the size of the input. As we are interested in applications that operate on all data in a network file system, quadratic execution time renders differencing using this method prohibitively expensive.

Most files likely to be encountered by a differencing system are small. A typical size is less than 1 kilobyte (see Mary G. Baker, John H. Hartman, Michael D. Kupfer, Ken W. Shirriff, and John K. Ousterhout, "Measurements of a distributed file system", Proceedings of the 13th Annual Symposium on Operating Systems, October 1991.) However, there may be a minority of files in a file system that are large, e.g., on the order of megabytes to gigabytes in size.

Our invention of the simple linear differencing method departs from the previous performance bounds discussed above. The simple linear differencing algorithm of the invention generates delta files in a single, linear time pass over the input files, and uses a constant amount of memory space to do so.

LINEAR VERSUS GREEDY—AN OVERVIEW

The linear algorithm achieves its runtime bounds by implementing the "next match policy". It attempts to take the longest match at a given offset by taking the longest matching string at the next matching prefix beyond the offset at which the previous match was encoded. In effect, it encodes the first matching string found, rather than searching all matching footprints for the best matching string. For versioned data, matching strings are often sequential, i.e., they occur in the same order in both files. When strings that match are sequential, the next matching footprint approximates the best match extremely well. In fact, this property holds for all changes that are insertions and deletions.

Figure 7A:
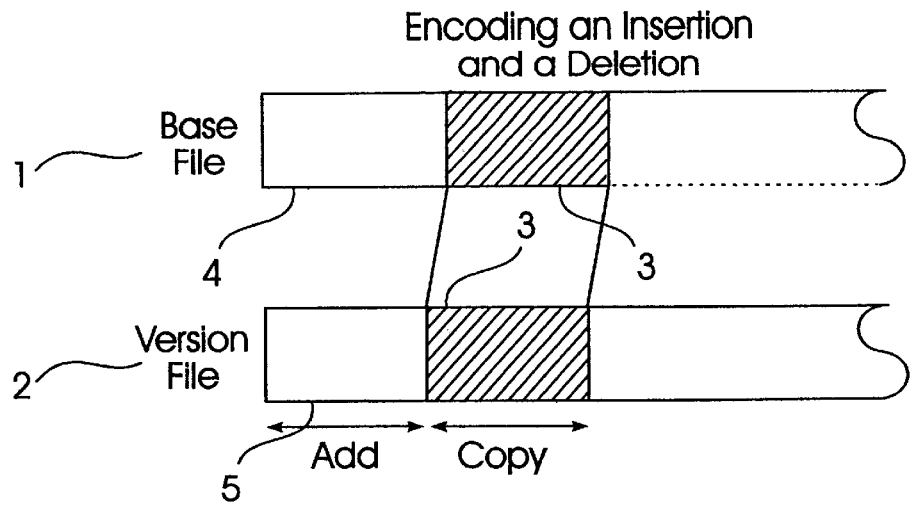
FIGS. 7A, 7B, and 7C are illustrations of implementations of functions as per the embodiment of FIGS. 5, 5A and 6.
Figure 7B:
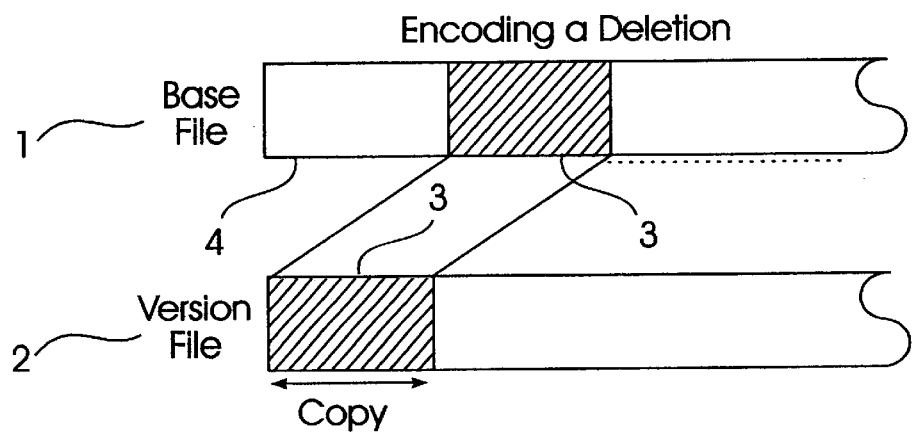
Figure 7C:
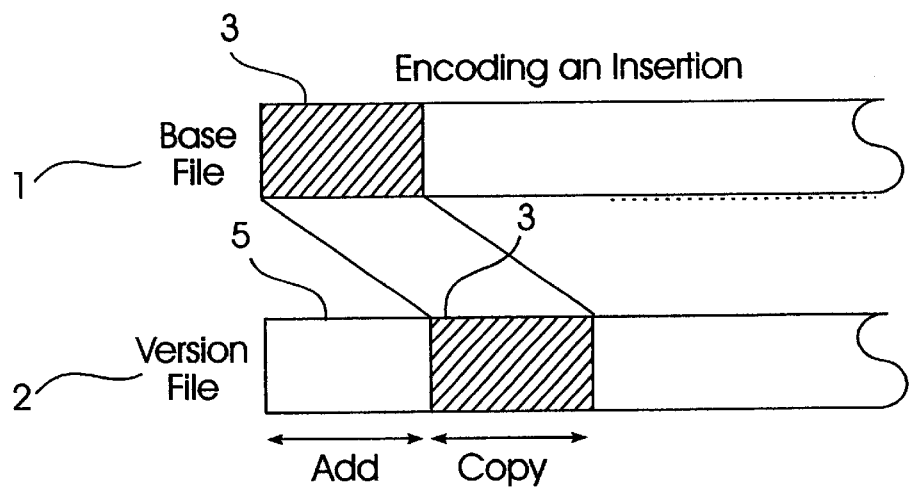

FIGS. 7A, 7B, and 7C respectively illustrate the encoding of an insertion and a deletion, a deletion, and an insertion. They exhibit a schematic of two versions of the same file in a base file (1) and a the version file (2). The base file is the older version, and the version file is the new version, to be encoded as a set of changes from (1).

In FIG. 7B, the first portion (4) of the base file (1) has been deleted, and is not present in the version file (2). The version file (2) then starts with a string (3) that matches a later offset in the base file (1), and is encoded as a copy.

In FIG. 7C, the version file starts with new data (5) that was not present in the base file (1). This region has been added to the version file (2), and is encoded as such. The following data in the version file (2) copies the start of the base file (3).

In FIG. 7A, the version file (2) starts with data (5) not in the base file and this data is encoded by an ADD command. The following data in (2) is not from the start of the base file (1), but copies a later portion of the base file (3). Thus, FIG. 7A represents the modification to a version when a delete (4) and an insert (5) occur together.

THE LINEAR ALGORITHM DESCRIBED

The linear algorithm differences in a single pass over both files. A preferred implementation is given, in pseudocode form, in FIG. 5.

Starting at offset zero in both files, ver_pos in the version and base_pos in the base file, generate footprints for the strings at these offsets. Store these footprints in the hash table, so that they may be used later to find matching strings. The algorithm then increments the pointers and continues hashing at the following offsets. Data is collected in the hash table until the algorithm finds colliding footprints between the base and version file. Footprints "collide" when a new string has a footprint that has the same value as the footprint of a string already stored in the hash table. The strings represented by the colliding footprints are checked for identity using the Verify function. If identical, the matching strings are encoded for output using the EmitCodes function.

The EmitCodes function is shown in FIG. 6. EmitCodes outputs all of the data in the version file, between the end of the previous copy and the offset of the current copy, as an add command.

The footprints from this data were not matched in the base file, and therefore need to be explicitly added to the delta file. Then, starting with the matching strings, the function attempts to extend the match as far as possible. Note that the match may be longer than the footprint length. The longest matching strings from these offsets are encoded as a copy and output to the delta file.

After the copy of strings is encoded, the algorithm updates the current offsets in both files to point to the end of the encoded copy. If the files are versions of each other, the copies should represent the same data in both files, and the end of both copies should be a point of file pointer synchronization. A "point of synchronization", in this case, is defined to be the relative offsets of the same data in the two file versions. The task of the linear differencing algorithm can be described as detecting points of synchronization, and subsequently copying from synchronized offsets.

We use the Footprint function and the hash table to find points of synchronization, and term this phase of operation the "hashing mode" of the algorithm. Once synchronized offsets have been found, the EmitCodes function uses a byte identity check to extend the match for as long as the offsets are synchronized, i.e., as long as the strings are the same. This phase of the algorithm is termed "identity mode". When the byte identity test fails, the respective file pointers are "out of synch", and the algorithm re-enters hashing mode.

ANALYSIS OF THE LINEAR TIME ALGORITHM

We often expect the changes between two versions of a file to be edits, insertions of information and deletions of information. This property implies that the common strings that occur in these files are sequential. An algorithm can then find all matching strings in a single pass over the inputs files. After finding a match, we can limit our search space for subsequent matches to only the file offsets greater than the end of the previous matching string.

Many files exhibit insert and delete only modifications, in particular, mail files and database files. Mail files have messages deleted out from the middle of the file and data appended to the end. Relational database files operate on tables of records, appending records to the end of a table, modifying records in place, and deleting records from the middle of the table. System logs have an even more rigid format, as they are append only files. Under these circumstances, we expect the linear algorithm to find all matches and compress data as efficiently as the greedy algorithm.

PERFORMANCE ANALYSIS

The presented algorithm operates both in linear time and constant space. At all times, the algorithm maintains a hash table of constant size. After finding a match, hash entries are flushed and the same hash table is reused to find the next matching footprint. Since this hash table neither grows nor is deallocated, the algorithm operates in constant space, roughly the size of the hash table, on all inputs.

Since the maximum number of hash entries does not necessarily depend on the input file size, the size of the hash table need not grow with the size of the file. The maximum number of hash entries is bounded by twice the number of bytes between the end of the previous copied string and the following matching footprint. On highly correlated files, we expect a small maximum number of hash entries, since we expect to find matching strings frequently.

The algorithm operates in time linear in the size of the input files as we are guaranteed to advance either the base file offset or the version file offset by one byte each time through the inside loop of the program. In identity mode, both the base offset and the version offset are incremented by one byte at each step. Whereas in hashing mode, each time a new offset is hashed, at least one of the offsets is incremented, as matching footprints are always found between the current offset in one file and a previous offset in another. Identity mode guarantees to advance the offsets in both files at every step, whereas hashing mode guarantees only to advance the offset in one file. Therefore, identity mode proceeds through the input at as much as twice the rate of hashing mode. Furthermore, the byte identity function is far easier to compute than the Karp-Rabin hashing function. On highly correlated files, the algorithm spends more time in identity mode than it would on less correlated versions. We can then state that the algorithm executes faster on more highly correlated inputs and the simple linear algorithm operates best on its most common input, similar version files.

SUB-OPTIMAL COMPRESSION

The algorithm achieves less than optimal compression when either the algorithm falsely believes that the offsets are synchronized, the assumption that all changes between versions consist of insertions and deletions fails to hold, or when the implemented hashing function exhibits less than ideal behavior. Examples are given in FIGS. 8A and 8B.

Figure 8A:
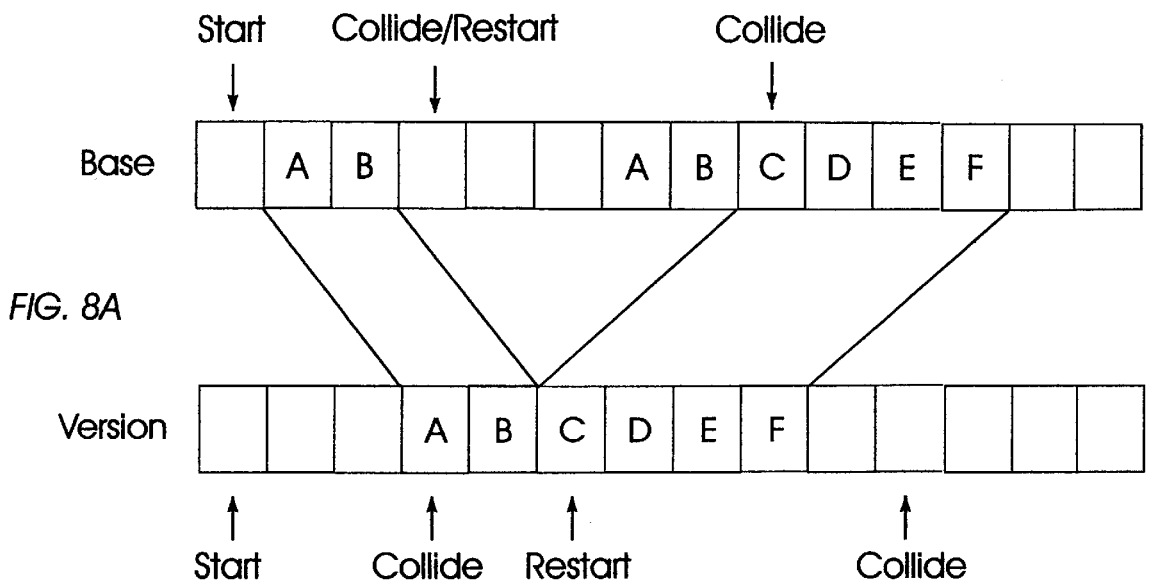
FIGS. 8A and 8B are illustrations of version matching scenarios described in connection with the invention.
Figure 8B:
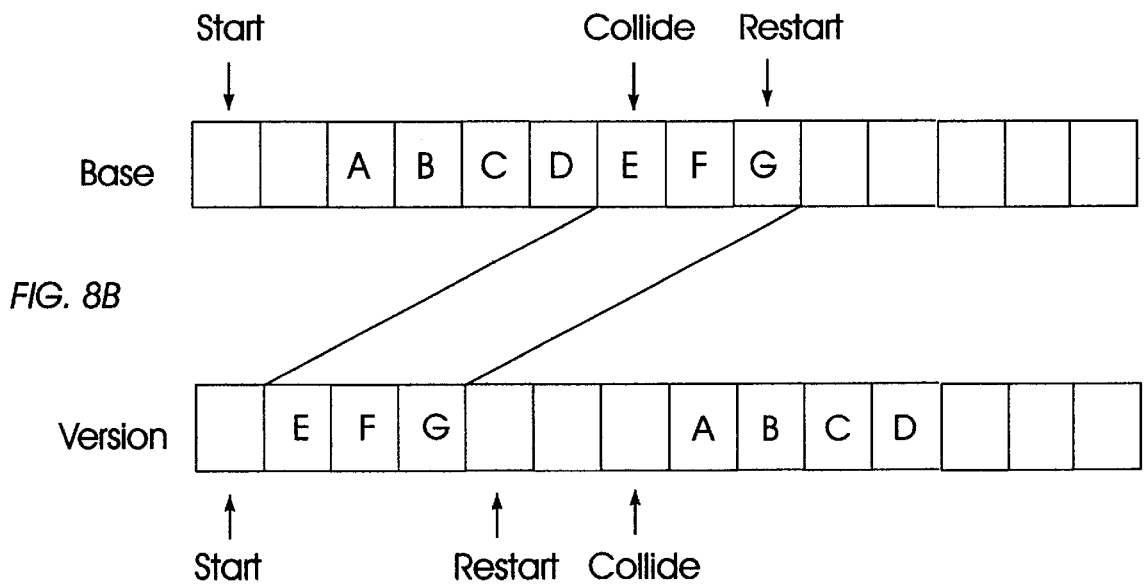

Consider first a rearranged sequence, such as that of FIG. 8B. In the version, the sequence EFG, which had followed the sequence ABCD in the base, now precedes ABCD.

Due to the assumption of changes being only inserts and deletes, the algorithm fails to find such rearranged strings. Upon encountering a rearranged string, the algorithm takes the next match it can find. This leaves some string in either the base file or in the version file that could be compressed and encoded as a copy, but will be encoded as an add, achieving no additional compression.

In FIG. 8B, the algorithm fails to find the copy of tokens ABCD since the string has been rearranged. In this simplified example, we have selected a prefix for footprints of length one. The algorithm encodes EFG as a copy, and then flushes the hash table, removing symbols ABCD that previously appeared in the base file. When hashing mode restarts, the ABCD match has been missed, and will be encoded as an add.

Next, consider a spurious match, such as that of FIG. 8A. The algorithm is also susceptible to spurious hash collisions, as a result of taking the next match rather than the best match. These collisions indicate that the algorithm believes that it has found synchronized offsets between the files, when in actuality the collision just happens to be between two matching strings at least as long as the footprint length.

In FIG. 8A, the algorithm misses the true start of the string ABCDEF in the base file (best match), in favor of the previous string at AB (next match). Upon detecting and encoding a "spurious" match, the algorithm achieves some degree of compression, just not the best compression. Furthermore, the algorithm never bypasses "synchronized offsets" in favor of a spurious match. This also follows directly from choosing the next match, and not the best match.

This result may be generalized. Given an ideal hash function, the algorithm never advances the file offsets past a point of synchronization.

Hashing functions are, unfortunately, not ideal. Consequently, the algorithm may also experience the blocking of footprints. Suppose that a fixed length string hashes to a footprint. If there is another footprint from a non-matching string in the same file, which is already occupying that entry in the hash table, then we say that the footprint is being blocked. In the simple linear algorithm, the second footprint is ignored and the first one is retained. This is the correct procedure to implement next match, assuming that each footprint represents a unique string. However, hash functions generally hash a large number of inputs to a smaller number of keys, and are therefore not unique. Strings that hash to the same value may differ, and the algorithm loses the ability to find strings matching the discarded footprint.

Footprint blocking could be addressed by any rehash function, or by hash chaining. However, this solution would destroy the constant space utilization bound on the algorithm. It also turns out to be unnecessary, as will be discussed below, in connection with the "more advanced algorithms".

The upcoming solution, called "undoing the damage", solves this problem expressly without relying on a probabilistic method. However, the following solution is adequate for basic algorithms. Instead of a rehash function, footprint blocking is addressed by scanning both forward and backward in identity mode. This simple modification allows the algorithm to go back and find matches starting at a footprint that was hash blocked. The longer the matching string, the less likely that the match will be blocked, as this requires consecutive blocked footprints. Under this solution, the algorithm still operates in constant space, and, although matches may still be blocked, the probability of blocking a match decreases geometrically with the length of the match.

MORE ADVANCED ALGORITHMS FOR BINARY DIFFERENCING

Up to this point, some basic techniques have been defined, which are useful for differencing arbitrary byte streams and two algorithms have been established using these methods. Next, advanced techniques will be given, which are useful for binary differencing. Also, the previous algorithms will be reformulated to take advantage of these methods.

"UNDOING THE DAMAGE"

The first method we term "undoing the damage". When a differencing algorithm runs, it finds strings to be copied and strings to be added and outputs them to a delta file. We modify this scheme and send the output encodings to a buffer. This buffer can be best thought of as a first in-first-out (FIFO) queue that caches the most recent encodings made by the algorithm. By caching encodings, an algorithm has the opportunity to recall a given encoding, and to exchange it for a better one. In many cases, an algorithm that uses this technique can make a quick decision as to an encoding, and, if this decision turns out to not be the best decision, the encoding will be undone in lieu of a more favorable encoding.

"CHECKPOINTING"

We also introduce a technique called "checkpointing" which reduces the amount of information that an algorithm needs to consider. Checkpointing takes a subset of all possible footprint values and calls these checkpoints. All footprints that are not in this subset are discarded and the algorithm runs on only the remaining checkpoints. This allows the file size and consequently the execution time to be reduced by an arbitrarily large factor. There is, unfortunately, a corresponding loss of compression with the runtime speedup. The technique is orthogonal to our other methods and can be applied to any of these algorithms.

REPAIRING BAD ENCODINGS

A linear run time differencing algorithm often has to encode stretches of input without complete information. The algorithm may have found a common string between the base and version files which represents the best known encoding seen in the files up to this point. However, as the algorithm passes over more of the input files, it may find a longer common string that would encode the same region of the file more compactly. Under these circumstances, it becomes beneficial to let the algorithm change its mind and re-encode a portion of the file. This is termed "undoing the damage" and allows the algorithm to recover from previous bad decisions.

In general, an algorithm performs the best known encoding of some portion of a version file as its current version file pointer passes through that region. If it later encounters a string in the base file that would better encode this region, the old encoding is discarded in favor of the new encoding.

For our differencing algorithms, the hash table acts as a short term memory and allows the algorithm to remember strings of tokens, so that when it sees them again, it may encode them as copies. This occurs when the algorithm finds a prior string in the base file that matches the current offset in the version file. Undoing the damage uses the symmetric case: matching strings between the current offset in the base file and a previous offset in the version file. The short term memory also allows the algorithm to recall and examine previous encoding decisions by recalling strings in the version file. These may then be re-encoded if the current offset in the base file provides a better encoding than the existing codewords.

To implement undoing the damage, the algorithm buffers codewords rather than writing them directly to a file. The buffer, in this instance, is a fixed size first in first out (FIFO) queue of file encodings called the "codeword lookback buffer". When a region of the file is logically encoded, the appropriate codewords are written to the lookback buffer.

The buffer collects code words until it is full. Then, when writing a codeword to a full buffer, the oldest codeword gets pushed out and is written to the file. When a codeword "falls out of the cache", it becomes immutable and has been committed to the file.

EDITING THE LOOKBACK BUFFER

Our algorithm performs two types of undoing the damage. The first type of undoing the damage occurs when the algorithm encodes a new portion of the version file. If the algorithm is at the current offset in the file being encoded, new data will be encoded and added to the lookback buffer. The algorithm attempts to extend that matching string backwards from the current offset in the version file. If this backward matching string exceeds the length of the previous codeword, that encoding is discarded and replaced with the new longer copy command. The algorithm will "swallow" and discard codewords from the top of the lookback buffer as long as the codewords in question are either:

A copy command that may be wholly re-encoded. If the command may only be partially re-encoded, the codeword may not be reclaimed and no additional compression can be attained; or Any add command. Since add commands are followed by the data to be added, reclaiming partial add commands benefits the algorithm. While no codewords are reclaimed, the length of the data to be added is reduced and the resulting delta file decreases in size proportionally.

The second type of undoing the damage is more general and may change any previous encoding, not just the most recent encoding. If a matching string is found between the current offset in the base file and a previous offset in the version file, the algorithm determines if the current encoding of this offset of the version file may be improved using this matching string. The algorithm searches through the buffer to find the first codeword that encodes a portion of the version file where the matching string was found. The matching string is then used to re-encode this portion, reclaiming partial add commands and whole copy commands.

IMPLEMENTING THE CODEWORD LOOKBACK BUFFER

Undoing the damage requires that the codeword lookback buffer be both searchable and editable, as the algorithm must efficiently look up previous encodings and potentially modify or erase those entries. The obvious implementation of the codeword lookback buffer is a linked list that contains the codewords, in order, as they were emitted from a differencing algorithm. This data structure has the advantage of simply supporting the insert, edit and delete operations on codewords.

However, linear search of a linked list can be time-consuming. Consequently, we implemented the codeword lookback buffer as a FIFO built on top of a fixed size region in contiguous memory.

Figure 9:
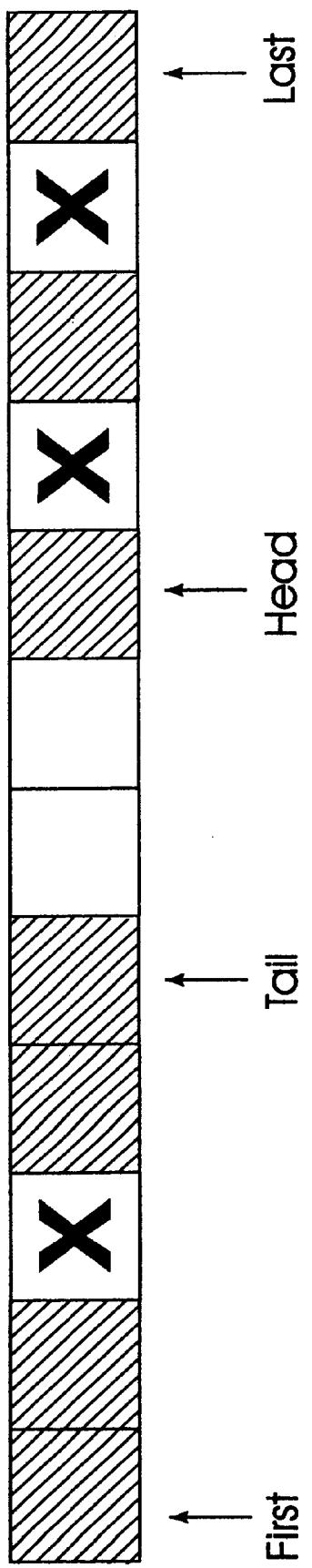
FIG. 9 is a diagram of a data structure produced and used by a system and method according to the invention.

FIG. 9 is a snapshot of such a FIFO buffer. Hatch-marked squares contain encodings, and Xs mark dummy encodings.

This region is divided into fixed sized elements. Each element is an entry in the codeword lookback buffer. An element in the lookback buffer contains the necessary data to emit its codeword. It also contains the version offset, the region of the version file that this entry encodes.

The version offsets in this data structure are increasing and unique. Therefore, any codeword in the n elements in this data structure can be looked up by version offset using binary search, which takes $O(\log n)$ time. A linear search, by contrast, would require $O(n)$ time for an n-element linked list.

The circular queue uses a fixed amount of memory. The pointers "first" and "last" mark the boundaries of the allocated region. Within this region, the data structure maintains pointers "head" and "tail", which are the logical beginning and end of the FIFO. These pointers allow the queue to wrap around the end of the allocated region. As per common buffering practice, simple pointer arithmetic around these four pointers supports the access of any element in the queue in constant time.

This implementation of a first-in-first-out queue suffers from no obvious support for insert and delete operations. Fortunately, our algorithms have special needs for insert and delete, and can reasonably be limited to a few operations on the FIFO.

The algorithms require the append operation to fill the queue with encodings. We support this operation by incrementing the tail pointer. When appending an element on the end, if the queue is full, we must expel the element pointed to by the head pointer and increment that pointer to make room for the new encoding.

Since our implementation does not support insert, all other operations are prohibited from increasing the number of elements in the queue. When editing the lookback buffer, we allow the algorithm to replace an element, logically delete an old encoding and insert a new encoding in its place, by editing the values of the codeword.

We also support the delete operation by marking a current encoding as a "dummy" codeword, i.e., a codeword that has been deleted from the buffer. An algorithm will ignore this codeword for all subsequent operations in the queue. For example, when encountering a dummy element while performing binary search, an algorithm ignores this codeword and takes the closest valid encoding. When a dummy codeword is flushed from the queue, an algorithm outputs no data to its delta file. Whenever an algorithm inserts a dummy, the usable length of the FIFO is reduced by one until that entry is flushed.

When undoing the damage, we are trying to minimize the size of the delta file encoding. In general, this implies reducing the number of codewords that encode any given region and undoing the damage can be supported with the replace and delete operations that our implementation provides. Consider an operation that merges two adjacent codewords into a single codeword. This operation performs two deletes in the FIFO and one insert that occurs where the elements were deleted. We perform this action by editing one of the codewords to contain the new longer copy command and the other is marked a dummy codeword.

There is one case in undoing the damage that is excluded by our implementation. Consider that we have encoded an add command, and we later find that a portion of that add command can be re-encoded as a copy command. This operation reduces the size of the output delta file while increasing the number of codewords. Since there is no insert operation, our implementation fails to support this unless we are lucky enough to either find a dummy codeword adjacent to the add or the copy we find can swallow an adjacent codeword in addition to the add codeword we are modifying. We feel that this limitation is a desirable tradeoff, since we achieve asymptotically superior search time.

THE ONE-AND-A-HALF-PASS ALGORITHM

Having developed the undoing the damage technique, we can improve previous methods for binary differencing. The one-and-a-half-pass algorithm modifies a greedy algorithm, such as the algorithm developed by Reichenberger (supra), producing a new algorithm that uses linear run time and a constant amount of memory.

The greedy algorithm always guarantees to find the best encoding by performing exhaustive search through its data structures for the longest matching string at any given footprint. At first glance it would seem that this method cannot be improved with undoing the damage. However, the greedy algorithm suffers from using both memory and execution time inefficiently. As a consequence of linear memory growth and quadratic execution time growth, the greedy algorithm fails to scale well and cannot be used on arbitrarily large files.

The one-and-a-half-pass algorithm modifies the greedy algorithm by altering data structures and search policies, to achieve execution time that grows linearly in the size of the input. Linear run-time comes at a price, and the modifications reduce the one-and-a-half-pass algorithm's ability to compactly represent versions. We can then use the undoing-the-damage technique to improve the compression that the algorithm achieves. The resulting algorithm compresses data comparably to the greedy algorithm, and executes faster on all inputs.

The significant modification from the greedy algorithm in the one-and-a-half-pass algorithm is that the latter uses the first matching string that it finds at any given footprint, rather than searching exhaustively through all matching footprints. The algorithm discards the link table that was used in the greedy algorithm. Using the hash table only, the algorithm maintains a single string reference at each footprint value.

By storing only a single string reference for each footprint, the algorithm implements a first matching string, rather than a best matching string, policy when comparing footprints. This could be potentially unsatisfactory, as the algorithm would consistently be selecting inferior encodings. Yet, by undoing the damage the algorithm avoids incurring the penalties for a bad decision. By choosing a first match policy, the algorithm spends constant time on any given footprint, resulting in linear execution time. By maintaining only a single hash table of fixed size, the algorithm operates in constant space.

Let us consider a long matching string of length L, and suppose our algorithm chooses, instead, a poor encoding. If we have a footprint of size F, then the algorithm has L-F different colliding footprints with which to find the long matching string. If it fails to find the string, this would imply that each and every one of the L-F footprints were overridden by another footprint. On long matches, this occurs with geometrically decreasing probability.

We notice that the previous argument assumes that both footprinting and hashing are well behaved. This is a very reasonable assumption when the input data falls within the tolerable parameters of the algorithm, but does not hold for all inputs.

In particular, hashing ceases to behave well when the hash table becomes densely populated. So, our first requirement is that the total number of stored footprints, i.e., the length of the input file, is smaller than the number of storage bins in our hash table.

We also require a suitably long footprint length, so that the footprints well represent the strings they identify. This condition must hold for any algorithm that uses a footprinting technique.

ONE AND A HALF PASS—STEP BY STEP

A preferred implementation of the one-and-a-half-pass algorithm is given, in pseudocode form, in FIG. 10. The algorithm first passes over the base file, baseFile, footprinting a string prefix at every byte offset, and storing these footprints for future lookup in a hash table. Having processed the base file, the algorithm footprints the first offset in the version file, verFile. The algorithm examines the hash table for a colliding footprint. If no footprints collide, we advance to the next offset by incrementing ver_pos and repeat this process.

When footprints collide the algorithm uses the Verify function to check the strings for identity. Strings that pass the identity test are then encoded and output to the fixup buffer. All symbols in the version file between the end of the last output codeword, add_start, and the beginning of the matching strings, ver_pos, are output as an add command. The matching strings are then output to the fixup buffer using the FixupBufferInsertCopy function.

The function FixupBufferInsertCopy (FIG. 11) not only outputs the matching strings to the fixup buffer, it also implements undoing the damage. Before encoding the matching strings, the algorithm determines if they match backwards. If they do, it deletes the last encoding out of the queue and re-encodes that portion of the version file by integrating it into the current copy command. Having reclaimed as many backwards code words as possible, the function simply dumps a copy command in the buffer and returns. This one type of undoing the damage is adequate in this case as the algorithm has complete information about the base file as it encodes the version file.

We term this algorithm one-and-a-half-pass, because it processes the base file twice and the version file once. Initially, this technique takes a single pass over the base file in order to build the hash table. Then, as the algorithm encodes the version file, random access is performed on the matching strings in the base file, inspecting only those strings whose footprints collide with footprints from the version file.

ALGORITHMIC PERFORMANCE

The algorithm of the invention has been found to run in linear time for all known inputs, including all files in a distributed file system, and further including database.

In FIG. 10, the algorithm generates a hash key for a footprint at each offset. The generation of a hash key takes constant time and must be done once for each footprint in the file, requiring total time linearly proportional to the size of the base file. Then, the version file is encoded. At each byte offset in the file, the algorithm either generates a hash key for the footprint at that offset, or uses the identity function to match the symbol as a copy of another symbol in the base file. In either case, the algorithm uses a constant amount of time at every offset for total time proportional to the size of the version file.

This algorithm has the potential to encode delta files as well as the greedy algorithm when the decision of choosing the first match is equally as good as choosing the best match. We can assert that the first match well represents the best match when the footprint hashing function generates "false matches" infrequently. Therefore, to achieve good compression, with respect to the greedy algorithm's compression, we must select a suitably long footprint. If the footprints uniquely represent the strings, the algorithms behave identically. However, the one-and-a-half-pass algorithm guarantees linear performance on all inputs, and cannot be slowed by many strings with the same footprint.

THE ONE PASS ALGORITHM

FIG. 12 is a pseudocode implementation of a "one pass" algorithm according to the invention. To implement the one pass algorithm, we modify the simple linear differencing algorithm of FIG. 5 with the advanced methods just introduced. The one pass algorithm improves the compression of the simple linear differencing algorithm without a significant depreciation in the execution time.

We recall that the simple linear differencing algorithm flushed its hash table discarding the available footprints. This was necessary in order to synchronize the pointers in the base and version file. To see that this is necessary, consider a frequently occurring string at the beginning of the base file. This string would match often in the version file and the pointer in the base file would never advance significantly beyond the occurrence of the common string. We therefore flush the hash table to ensure that no string matches more than once and consequently the file pointers are guaranteed to advance.

However, by flushing the hash table, the algorithm discards information that could later be valuable. If the algorithm was to make an encoding that was not from a point of synchronization, the chance to later find a point of synchronization from that string is lost. The one pass algorithm does not flush the hash table in order to find potentially missed points of synchronization.

The algorithm must then avoid the pitfall of not incrementing the file pointer when matching a frequently occurring common string. The algorithm does this by guaranteeing that the file pointers in both files are non-decreasing always and that when offsets are hashed, the pointers in both files advance. So, rather than trying to find the exact point of synchronization, the algorithm collects data about all previous footprints.

The data that it accumulates arrives incrementally, as it advances through the input files. The algorithm uses a replacement rule to update the hash table when there are identical footprints from the same file. This rule discards old information, and preferentially keeps information close to the point of synchronization. The algorithm need not worry about making a bad encoding.

Returning to the example of having a probable string in the base file, we notice two things. First, that any bad encodings made using this string can later be repaired by undoing the damage. Also, if the string is a probable match in the version file, verFile, (see FIG. 12), it should also occur frequently in the base file, baseFile. Each time the same footprint occurs in the same file, the reference to the string that generated the old footprint is purged from the hash table in favor of the new string. Our forward replacement rule prevents any single probable footprint from preventing the file pointers from advancing.

ONE PASS STEP BY STEP

The one pass algorithm starts at offset zero in both files, generates footprints at these offsets and stores them in the hash tables. Footprints from verFile go into verhashtbl and footprints from baseFile in bashashtbl. It continues by advancing the file pointers, ver_pos and base_pos, and generating footprints at subsequent offsets. When the algorithm finds footprints that match, it first ensures that the strings these footprints represent are identical, using the Verify function.

For identical strings, it outputs the matched data to the fixup buffer, using the EmitCodes subroutine, given in pseudocode form in FIG. 13.

The EmitCodes subroutine has been modified from its previous incarnation (FIG. 6), to output codewords to the fixup buffer, rather than outputting data directly to the file. The data that precedes the start of the copy is encoded in an add command using the function FixupBufferlnsertAdd. The matched data is then output, using the function FixupBufferlnsertCopy.

FixupBufferlnsertCopy implements one type of undoing the damage. Before encoding the current copy, the string is checked to see if it matches backwards. If the match extends backwards, the function re-encodes the previous codewords, if it produces a more compact encoding.

The one pass algorithm also implements undoing the damage when the current offset in baseFile matches a previous offset in verFile. This case of undoing the damage is different as it attempts to repair an encoding from an arbitrary point in the cache, rather than just re-encoding the last elements placed in the codeword fixup buffer. In fact, the target codeword may have fallen out of the cache and not even be in the fixup buffer.

The function FixupEncoding, given in FIG. 14, performs this type of undoing the damage. After finding the first codeword that encodes a portion of the string found in the version file, as many encodings as possible are reclaimed to be integrated into a single copy command.

The outer loop in the routine OnePass only runs when either the base_active or version_active flag is set. These flags indicate whether the file pointer has reached the end of the input. It is necessary to read the whole version file in order to complete the encoding. It is also necessary to finish processing of the base file, even if the version file has been wholly read, as the algorithm may use this information to undo the damage. This also differs from the simple linear differencing algorithm which completes after finishing processing in the version file. The simple linear differencing algorithm has no motivation to continue footprinting the base file after the version file has been encoded, as it cannot modify previous encodings.

WINDOWS INTO THE PAST

The per file hash tables in the one pass algorithm remembers the most recent occurrence of each footprint in each file. This results as the algorithm elects to replace existing footprints in the hash table with conflicting new occurrences of the same footprints. The hash tables tend to have complete information for the footprints from the most recent offsets. For older offsets, the hash table becomes incomplete with these footprints being overwritten. It is appropriate to consider this "memory" of previous strings through footprints as a window into the most recent offsets in each file. This window is the region over which the algorithm can act at any given time. A footprint that has been expelled from this window cannot be used to create a copy command or to undo the damage.

Since data is replaced by conflicting footprints, the window in the past does not consist of contiguous data, but data about past footprints that gets less dense at offsets further in the past from the current file offset. This window dictates the effectiveness of the algorithm to detect transposed data. Consider two data streams composed of long strings A and B. One version of this data can be described by AB and the other by BA. We term this a transposition. This type of rearranged data can be detected and efficiently encoded assuming that the window into the past covers some portion of the transposed data. It is thereby beneficial for encoding transpositions to have a hash table that can contain all of the footprints in the base file.

ONE PASS AND ONE-AND-A-HALF-PASS COMPARED

These algorithms are strikingly similar in their use of the same methods and data structures. Both algorithms use hash tables and footprinting to locate matching strings. Both algorithms implement undoing the damage to allow them to make hasty and efficient decisions. Perhaps the significant difference between the algorithms is the manner in which they access data in the input streams. The one and a half pass algorithm accesses data sequentially in the base file when building the hash table, and accesses data sequentially in the version file when encoding. It only performs random access when verifying that colliding footprints are identical. This algorithm also only uses one hash table, so it uses memory slightly more efficiently.

The one pass algorithm may perform random access in either file but on highly correlated inputs this access should always be near the current file pointers and not to distant offsets in the past. What distinguishes the one pass algorithm from other algorithms is its on-line nature. Since the algorithm starts encoding the version file upon initiation, it does not fill a hash table with footprints from the base file before encoding the version file, the algorithm emits a constant stream of output data. In fact, the algorithm can be described as having a data rate. This is a very important feature if one uses the algorithm to serve a network channel or for any other real time application.

The one pass algorithm behaves well under arbitrarily long input streams in that it only loses the ability to detect transposed data. The same cannot be said of the one-and-a-half-pass algorithm. Since it has only a single hash table with no ability to re-hash, when that hash table is full, the algorithm must discard footprints. This results in pathologically poor performance of inputs that overflow the one-and-a-half-pass algorithm's hash table. Note that both algorithms fail to perform optimally when the input is such that their hash tables are filled. In the next section, we will address this problem using a method called checkpointing.

USING CHECKPOINTS TO REDUCE INFORMATION

In our analysis of the advanced algorithms presented in this chapter, we notice that both algorithms have performance limitations associated with the size of the input file. These limitations arise as a result of the hash tables these algorithms use becoming overloaded. As increasing the size of the hash table is not a scalable solution, we present a method to reduce the amount of information in a file that is compatible with the one pass and one-and-a-half-pass algorithms.

The checkpointing method declares a certain subset of all possible footprints checkpoints. The algorithm will then only operate on footprints that are in this checkpoint subset. We still need to run the hashing function at every offset, but only those footprints that are in the checkpoint subset participate in finding matches. This reduces the entries in the hash table and allows algorithms to accept longer inputs without the footprint entry and lookup operations breaking down.

This method allows us to reduce the file size by an arbitrary factor chosen so that our algorithm exhibits its best performance. We then need to address the issues of selecting checkpoints and integrating checkpointing into the existing algorithms.

SELECTING CHECKPOINTS

We choose the number of checkpoints in a file in order to achieve good behavior out of the hash table for storage and look up. A heuristic for selecting checkpoints is to choose a value so that the number of checkpoints found in a given input stream will number approximately half the size of the hash table, i.e. the hash table is populated to half capacity. Letting F be the set of all possible footprints, we select a set C of checkpoints such that $C \subset F$.

For an input stream of length L and a hash table of size H, we choose to have H/2 checkpoints occur in the input stream. We expect on average to obtain a checkpoint every $|F|/|C|$ tokens. (For a set S, $|S|$ denotes the cardinality of that set.) An algorithm must choose $|C|$ such that the number of checkpoints that appear over an input stream of length L produces H/2 hash entries. A rule to approximate this condition chooses $|C|$ such that $$|C| \le \frac{H|F|}{2L}$$

This only approximates the constraint because our argument is probabilistic and we cannot guarantee that one of our checkpoints will not be very popular and occur frequently. Such behavior is not problematic for our algorithms as they only store one string at any given checkpoint. This will not produce undesirable behavior in the footprinting storage and lookup operations. Instead, this checkpoint will generally not generate copy encodings in the algorithm as we have stored only one of its many occurrences.

An algorithm must also ensure that the set C of all checkpoints can address every element in the hash table, i.e. $|C| \ge H$. To satisfy this requirement, an algorithm must choose an appropriately large footprint size. An algorithm can select a minimum cardinality of the set F to ensure this bound on $|C|$. As the footprint length in bits is the logarithm of $|F|$, we choose a footprint f of length $|f|$ such that $$|f| \ge \lceil \log(|F|) \rceil \ge \log(2L)$$

Having constrained the number of desired checkpoints and the minimum footprint length, we now turn to the checkpoint selection process. With the goals of efficiency and simplicity, we choose checkpoints using test equality with the modulo operation. So given $|C|$ checkpoints and $|F|$ footprints, a given footprint $f \in F$ is a checkpoint if $$f \bmod(|F|/|C|) = k$$

for some integer k chosen from the interval $[0, |F|/|C|)$.

A non-zero value for k is selected, to ensure that the string of all zeros is not in the checkpoint set. Many types of data stuff zeros for alignment or empty space. Therefore, this string, with the corresponding checkpoint equal to zero, is frequently occurring, and is therefore not beneficial.

INTEGRATING CHECKPOINTS WITH DIFFERENCING ALGORITHMS

We perform checkpointing in an on-line fashion and implement checkpointing as a conditional test that guards the inside loop of an algorithm. Our algorithms perform checkpointing by testing every footprint as we hash it. When generating a footprint, if it meets the criterion described above, then continue the algorithm normally. If it fails this test, then advance to the next offset and continue execution.

This implementation is orthogonal to the algorithms that use it, and can be isolated to the one step where the algorithm generates the next footprint.

CHECKPOINTS AND THE ONE-AND-A-HALF-PASS ALGORITHM

Checkpointing alleviates the failure of the one-and-a-half-pass algorithm operating on large input files. By choosing an appropriate number of checkpoints as shown above, the algorithm can fit the contents of any file into its hash table.

Of course, nothing comes for free: checkpointing has a negative effect on the ability of the algorithm to detect small matching strings between file versions. If an algorithm is to detect and encode matching strings, then one of the footprints of this string must be a checkpoint. Short matching strings will have few colliding footprints, and will consequently be missed with greater likelihood. On the other hand, for versioned data, we expect highly correlated input streams, and can expect long matching strings which contain checkpoints with increasing probability.

We also note that the checkpointing technique relies upon undoing the damage, and performs better on the one-anda-half-pass algorithm than the greedy algorithm. Since checkpointing does not look at every footprint, an algorithm is likely to miss the starting offset for matching strings. With undoing the damage, this missed offset is handled transparently, and the algorithm finds the true start of matching strings without additional modifications to the code.

CHECKPOINTING AND THE ONE PASS ALGORITHM

The one pass algorithm has problems detecting transpositions when its hash table becomes over-utilized. This feature is not so much a mode of failure as a property of the algorithm. Applying checkpointing as we did in the one-and-a-half-pass algorithm allows such transpositions to be detected. Yet, if the modification of the data does not exhibit transpositions, then the algorithm sacrifices the ability to detect fine grained matches and gains no additional benefit.

With the one pass algorithm, the appropriate checkpoint value depends on the nature of the input data. For data that exhibits only insert and delete modifications, checkpointing should be disregarded altogether. Any policy decision as to the number of checkpoints is subject to differing performance, and the nature of the input data needs to be considered to formulate such a policy.

It is believed rarely to be correct to choose a policy as drastic as that given above, because the algorithm will then never fill its hash table, and will never use its full string matching capabilities. Perhaps a more appropriate heuristic would be to choose enough checkpoints so that the window into the past covers more than half of the input data stream.

SUMMARY

In this work, we have reviewed the previous art and introduced new methods for file differencing. The previous methods include footprinting for finding matching strings, Karp-Rabin hashing functions, and delta file encoding. To these existing methods, we add a checkpointing technique for reducing the information in a file and an undoing the damage technique to allow algorithms to repair sub-optimal encodings. Having developed improved methods, we formulate new algorithms for file differencing. The algorithms we present provide a means to explore advanced techniques in file differencing.

Three algorithms for binary differencing were included in the presentation of this invention. These algorithms embody methods for file differencing. All of these algorithms run in constant space and linear time. The algorithms describe policies for string matching and pointer movement that exceed previous methods and allow differencing to be applied to data of any size and format without a priori knowledge of said data.

The simple linear algorithm differences files in a single pass over both versions of a file. Pointers in both files are updated in a non-decreasing fashion when generating footprints. This algorithm enforces strict synchronization between file pointers that aids the algorithm in find matching strings without performing exhaustive search through all strings with matching footprints.

The one pass algorithm adds undoing the damage and checkpointing to the simple linear algorithm. These additions allow the one pass algorithm to find strings that would better encode portions of the version file and consequently improve compression. The one pass algorithm is also more robust in that it can detect and achieve compression in the presence of aliased and transposed data. Both this algorithm and its predecessor run on-line and have an output data rate. These algorithms consequently produce a reliable stream of data and can be used in applications that require data to be present in a timely manner, i.e. real time applications.

We also present the one and a half pass algorithm. This algorithm differences files in a single pass over the version file and a double pass over the base file. The algorithm first passes over the base version of the file collecting information in its hash table. After complete processing of the base file, it passes over the version file finding strings with matching footprints and verifying them in the base file. This algorithm does implement undoing the damage and checkpointing. The one and a half pass algorithm does not have the on-line property, but does compress data as rapidly and more compactly than the on-line algorithms.

Having presented a family of efficient and general differencing algorithms, we establish file differencing as a viable data compression method for any application that versions files. We envision differencing as an enabling technology that will amplify the performance of network applications on low bandwidth channels, and will help mitigate resource limitations for distributed computing and Internet applications.

Using the foregoing specification, the invention may be implemented using standard programming and/or engineering techniques using computer programming software, firmware, hardware or any combination or subcombination thereof. Any such resulting program(s), having computer readable program code means, may be embodied or provided within one or more computer readable or usable media such as fixed (hard) drives, disk, diskettes, optical disks, magnetic tape, semiconductor memories such as read-only memory (ROM), etc., or any transmitting/receiving medium such as the Internet or other communication network or link, thereby making a computer program product, i.e., an article of manufacture, according to the invention. The article of manufacture containing the computer programming code may be made and/or used by executing the code directly from one medium, by copying the code from one medium to another medium, or by transmitting the code over a network.

An apparatus for making, using, or selling the invention may be one or more processing systems including, but not limited to, a central processing unit (CPU), memory, storage devices, communication links, communication devices, servers, I/O devices, or any subcomponents or individual parts of one or more processing systems, including software, firmware, hardware or any combination or subcombination thereof, which embody the invention as set forth in the claims.

User input may be received from the keyboard, mouse, pen, voice, touch screen, or any other means by which a human can input data to a computer, including through other programs such as application programs.

One skilled in the art of computer science will easily be able to combine the software created as described with appropriate general purpose or special purpose computer hardware to create a computer system and/or computer subcomponents embodying the invention and to create a computer system and/or computer subcomponents for carrying out the method of the invention. While the preferred embodiment of the present invention has been illustrated in detail, it should be apparent that modifications and adaptations to that embodiment may occur to one skilled in the art without departing from the spirit or scope of the present invention as set forth in the following claims.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A machine implementable method for forming a compressed differentially encoded image of a version file as derived from a base file, said image being defined over a set of file building operations (ADD, COPY, END), descriptors, and address pointers and utilizing the version and base files comprising the steps of:

(a) recursively forming a hash function first signature set of the base file in a predetermined serial order or direction;

(b) recursively forming a progressively increasing hash function second signature set of the version file in said predetermined serial order or direction, and comparing each signature in the second set contemporaneous with its generation with the signatures in the first set;

(c) upon a comparison match of signatures and verification of contents, encoding a difference file ad seriatim as a portion of the version file contents up to the point of the instant comparison match from the later of either the start of the version file or the last comparison match, followed by a COPY command, a length attribute, and pointer to the base file location of the instant matching contents; and (d) repeating steps (b) and (c) until the version file becomes exhausted.

2. A machine implementable method for forming a compressed differentially encoded image of a version file as derived from a base file, said image being defined over a set of file building operations (ADD, COPY, END), descriptors, and address pointers and utilizing the version and base files comprising the steps of:

(a) recursively forming a progressively increasing hash function first signature set of the base file in a predetermined serial order or direction and recursively forming a progressively increasing hash function second signature set of the version file in said predetermined serial order or direction;

(b) comparing each signature in the second set contemporaneous with its generation with the signatures in the first set contemporaneous with their generation;

(c) upon a comparison match of signatures and verification of contents, encoding a difference file ad seriatim as a portion of the version file contents up to the point of the comparison match from the later of either the start of the version file or the last comparison match, followed by a COPY command, length attribute, and pointer to the base file location of the instant matching contents; and (d) repeating steps (a)–(c) starting from the end of the matching contents in the respective base and version files until exhaustion of the respective base and version files.

3. A machine implementable method for forming a compressed differentially encoded image of a version file as derived from a base file, said image being defined over a set of file building operations (ADD, COPY, END), descriptors, and address pointers and utilizing the version and base files comprising the steps of:

(a) recursively scanning the base file using a window of m bytes length including shifting the window in the same direction k<m bytes/recursion, forming a hash function signature of the window contents for each recursion of the base file, and recording said base file signature in a buffer;

(b) recursively scanning the version file using a window of m bytes length including shifting the window in the same direction k<m bytes/recursion, forming a hash function signature of the window contents for each recursion of the version file, and comparing each hash function signature as generated from the version file with the buffer stored signatures of the base file;

(c) upon a comparison match of signatures and verification of contents, encoding a difference file ad seriatim as an ADD command plus version file contents from the later of either the start of the version file or the last comparison match up to the point of the instant comparison match, followed by a COPY command, length attribute, and pointer to the base file location of the matching contents; and (d) repeating steps (b) and (c) until the version file scan is exhausted.

4. The method according to claim 3, wherein said method further includes the steps of forming a set of base file signatures from a predetermined subset of all possible base file signatures; and comparing the signatures derived from the version file with ones of the predetermined subset of base file signatures.

5. The method according to claim 3, wherein the hash function h(s) is of the form x=h(s)=s modulo q, q being a prime number, and wherein the substep of forming a hash function for an m character substring $(s_k s_{k+1} \ldots s_{k+m-1})$ includes the step of transforming the m character string $(s_k s_{k+1} \ldots s_{k+m-1})$ into an integer residue $x_k = s_k b^{m-1} + s_{k+1} b^{m-2} + \ldots + s_{k+m-1}$, b being a radix, the value of $x_k$ being determined according to the relation $x_{k+1} = (x_k - s_k b^{m-1})b + s_{k+m}$.

6. A machine implementable method for forming a compressed differentially encoded image of a version file as derived from a base file, said image being defined over a set of file building operations (ADD, COPY, END), descriptors, and address pointers and utilizing the version and base files comprising the steps of:

(a) recursively scanning the base file and version file respectively in time overlapped relation in a predetermined serial order or direction using respective windows of m bytes granularity and k<m bytes alignment starting from predetermined locations in the respective files, forming a hash function signature of the window contents for each recursion of the respective files, and comparing the signatures of the version file with the signatures of the base file;

(b) upon a comparison match of signatures and verification of contents, encoding a difference file ad seriatim as an ADD command plus version file contents up to the point of the instant comparison match from the later of either the starting point or the last comparison match, followed by a COPY command, length of the matching contents, and pointer to the base file location of the instant matching contents; and (c) repeating steps (a)–(b) starting from the end of the matching contents in the respective base and version files until exhaustion of the respective base and version files.

7. The method according to claim 6, wherein k=1 byte window shift for each recursion.

8. The method according to claim 6, wherein step (c) further includes the steps of:

(c1) recording successive encodings of the difference file as a linked list in a code generated order into an addressable buffer;

(c2) ascertaining whether the matching portion of the base and version files associated with each copy command is backwards extensible;

(c3) in the event such matching portion is backwards extensible, re-encoding the copy command and its attributes to include the extensible matching portion; and (c4) replacing the counterpart entry in the linked list.

9. The method according to claim 6, wherein said method further includes the steps of forming a set of base file signatures from a predetermined subset of all possible base file signatures; and comparing the signatures derived over the version file with ones of the predetermined subset of base file signatures.

10. The method according to claim 9, wherein the number of base file signatures in the subset should approximate one-half of the number of all possible base file signatures.

11. The method according to claim 9, wherein the hash function h(s) is of the form x=h(s)=s modulo q, q being a prime number, and wherein the substep of forming a hash function for an m character substring $(s_k s_{k+1} \ldots s_{k+m-1})$ includes the step of transforming the m character string $(s_k s_{k+1} \ldots s_{k+m-1})$ into an integer residue $x_k = s_k b^{m-1} + s_{k+1} b^{m-2} + \ldots + s_{k+m-1}$, b being a radix, the value of $x_k$ being determined according to the relation $x_{k+1} = (x_k - s_k b^{m-1})b + s_{k+m}$.

12. An apparatus for forming a compressed differentially encoded image of a version file as derived from a base file, said image being defined over a set of file building operations (ADD, COPY, END), descriptors, and address pointers and utilizing the version and base files comprising:

first and second shift registers of m-bytes in length for respectively storing a portion of the base file and version file;

first circuits coupling the first register for recursively scanning the base file by shifting the base file in the first register in the same direction k<m bytes/recursion, said first circuits including an arrangement for forming a hash function signature of the first register contents for each recursion of the base file, and for recording said base file signature in a buffer;

second circuits coupling the second register for recursively scanning the version file by shifting the version file in the second register in the same direction k<m bytes/recursion, said second circuits including the arrangement for forming a hash function signature of the window contents for each recursion of the version file, and third circuits for comparing each hash function signature as generated from the version file with the buffer stored signatures of the base file; and fourth circuits coupling the first and second registers, the first, second, and third circuits and responsive to a comparison match of signatures and verification of contents for encoding a difference file ad seriatim as an ADD command plus version file contents up to the point of the instant comparison match from the later of either starting point of the last comparison match, followed by a COPY command, length of the matching contents, and pointer to the base file location of the instant matching contents, and invoking the next recursion of steps (b) and (c) until the version file scan is exhausted.

13. An article of manufacture comprising a machine readable memory having stored therein a plurality of processor executable control program steps for forming a compressed differentially encoded image of a version file derived from a base file, said image being defined over a set of file building operations (ADD, COPY, END), descriptors, and address pointers and utilizing the version and base files, said control program steps include:

(a) a control program step for recursively scanning the base file using a window of m bytes length including shifting the window in the same direction k<m bytes/ recursion and forming a hash function signature of the window contents for each recursion of the base file, and recording said base file signature in a buffer;

(b) a control program step for recursively scanning the version file using a window of m bytes length including shifting the window in the same direction k<m bytes/ recursion forming a hash function signature of the window contents for each recursion of the version file, and comparing each hash function signature as generated from the version file with the buffer stored signatures of the base file; and (c) a control program step upon a comparison match of signatures and verification of contents for encoding a difference file ad seriatim as an ADD command plus version file contents from the later of either the start of the version file or the last comparison match up to the point of the instant comparison match, followed by a COPY command, length of the matching contents, and pointer to the base file location of the instant matching contents, and for invoking the next recursion of steps (b) and (c) until the version file scan is exhausted.

* * * * *